(12) United States Patent
Kanda et al.

(10) Patent No.: US 10,396,547 B2
(45) Date of Patent: Aug. 27, 2019

(54) SEMICONDUCTOR DEVICE AND POWER CONTROL DEVICE

(71) Applicant: RENESAS ELECTRONICS CORPORATION, Tokyo (JP)

(72) Inventors: Ryo Kanda, Tokyo (JP); Hiroshi Kuroiwa, Tokyo (JP); Tetsu Toda, Tokyo (JP); Yasushi Nakahara, Ibaraki (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 87 days.

(21) Appl. No.: 15/702,327

(22) Filed: Sep. 12, 2017

(65) Prior Publication Data

US 2018/0076614 A1 Mar. 15, 2018

(30) Foreign Application Priority Data

Sep. 15, 2016 (JP) .................. 2016-180786

(51) Int. Cl.
*H02H 7/08* (2006.01)
*H02H 1/04* (2006.01)
*H01L 29/40* (2006.01)
*H01L 29/78* (2006.01)
*H01L 29/861* (2006.01)
(Continued)

(52) U.S. Cl.
CPC ......... *H02H 7/0838* (2013.01); *H01L 29/405* (2013.01); *H01L 29/7816* (2013.01); *H01L 29/861* (2013.01); *H02H 1/04* (2013.01); *H03K 17/0416* (2013.01); *H03K 17/0822* (2013.01)

(58) Field of Classification Search
CPC .... H02H 7/0838; H02H 1/04; H03K 17/0416; H03K 17/0822; H01L 29/405; H01L 29/7816; H01L 29/861

USPC .......................................................... 361/31
See application file for complete search history.

(56) References Cited

U.S. PATENT DOCUMENTS 9,112,344 B2    8/2015  Fukuta et al.
2005/0218489 A1*  10/2005  Satou ................ H01L 23/49575
                                              257/678

(Continued)

FOREIGN PATENT DOCUMENTS

JP    2013-198185 A    9/2013

OTHER PUBLICATIONS

European Search Report issued in corresponding European Patent Application No. 17188615.3, dated Feb. 1, 2018.

*Primary Examiner* — Jorge L Carrasquillo
*Assistant Examiner* — Devon A Joseph
(74) *Attorney, Agent, or Firm* — McDermott Will & Emery LLP

(57) ABSTRACT

To realize a reduction in the number of parts in a system including a driver IC (semiconductor device). A high potential side power supply voltage is applied to a power supply application area. A high side area is formed with a circuit which includes a driver driving a high side transistor and is operated at a boot power supply voltage with a floating voltage as a reference. A low side area is formed with a circuit operated at a power supply voltage with a low potential side power supply voltage as a reference. A first termination area is disposed in a ring form so as to surround the power supply application area. A second termination area is disposed in a ring form so as to surround the high side area.

20 Claims, 16 Drawing Sheets

(51) Int. Cl.
*H03K 17/0416* (2006.01)
*H03K 17/082* (2006.01)

(56) References Cited

U.S. PATENT DOCUMENTS

| | | | |
|---|---|---|---|
| 2009/0315609 A1* | 12/2009 | Nakazono | H03K 19/018571 |
| | | | 327/333 |
| 2016/0043624 A1* | 2/2016 | Jarvinen | H02M 1/084 |
| | | | 323/271 |
| 2016/0056818 A1* | 2/2016 | Kanda | H03K 17/6872 |
| | | | 318/504 |
| 2016/0142049 A1* | 5/2016 | Richardson | H03K 17/687 |
| | | | 327/109 |
| 2017/0019093 A1* | 1/2017 | Kanda | H03K 3/356113 |
| 2018/0004238 A1* | 1/2018 | Shen | H03K 17/063 |

\* cited by examiner

SEMICONDUCTOR DEVICE AND POWER CONTROL DEVICE

CROSS-REFERENCE TO RELATED APPLICATIONS

The disclosure of Japanese Patent Application No. 2016-180786 filed on Sep. 15, 2016 including the specification, drawings and abstract is incorporated herein by reference in its entirety.

BACKGROUND

The present invention relates to a semiconductor device and a power control device, and to, for example, a semiconductor device and a power control device used in the field of power electronics.

There has been shown in, for example, Patent Document 1, a configuration in which a terminal of a drive IC is coupled to a collector of an external switching element through an external resistor and diode and coupled to an emitter of the switching element through an external capacitor. The drive IC detects an overcurrent of the switching element based on a voltage (Vdesat) of the terminal.

RELATED ART DOCUMENTS

[Patent Document]
[Patent Document 1] Japanese Unexamined Patent Application Publication Laid-Open No. 2013-198185

SUMMARY

For example, there is a case where a driver IC (Integrated Circuit) driving a half bridge circuit or the like is equipped with a function of monitoring a voltage of each node in the half bridge circuit. Typically, as shown in Patent Document 1, there are mentioned a function of monitoring an emitter-collector voltage of a switching element (e.g., IGBT (Insulated Gate Bipolar Transistor) in a half bridge circuit to detect an overcurrent, etc.

Here, a collector of a high-side switching element is applied with, for example, a power supply voltage of a few hundred V or the like. Thus, in order to monitor an emitter-collector voltage of the switching element, there is a need to normally provide a diode satisfying a high breakdown voltage specification, etc. outside the drive IC as shown in Patent Document 1. As a result, the number of parts is increased, and the enlargement of a system including the drive IC, an increase in cost, etc. may occur.

Embodiments to be described later have been made in view of such a situation. Other objects and novel features thereof will become apparent from the description of the present specification and the accompanying drawings.

A semiconductor device according to one embodiment is comprised of one semiconductor chip and drives an external high side transistor coupled between a high potential side power supply voltage and a floating voltage, and an external low side transistor coupled between the floating voltage and a low potential side power supply voltage. The semiconductor device has a high potential side power supply pad, a floating pad, a low potential side power supply pad, a power supply application area, a high side area, a low side area, and first and second termination areas. The high potential side power supply pad, the floating pad, and the low potential side power supply pad are respectively coupled to the high potential side power supply voltage, the floating voltage, and the low potential side power supply voltage. The high potential side power supply voltage is applied to the power supply application area. The high side area includes a circuit including a high side driver driving the high side transistor and operated at a first power supply voltage with the floating voltage as a reference. The low side area is formed with a circuit including a low side driver driving the low side transistor and operated at a second power supply voltage with the low potential side power supply voltage as a reference. The first termination area is disposed in a ring form so as to surround the power supply application area, and the second termination area is disposed in a ring form so as to surround the high side area.

According to the one embodiment, it is possible to reduce the number of parts in a system including a driver IC (semiconductor device).

DETAILED DESCRIPTION

Figure 1:
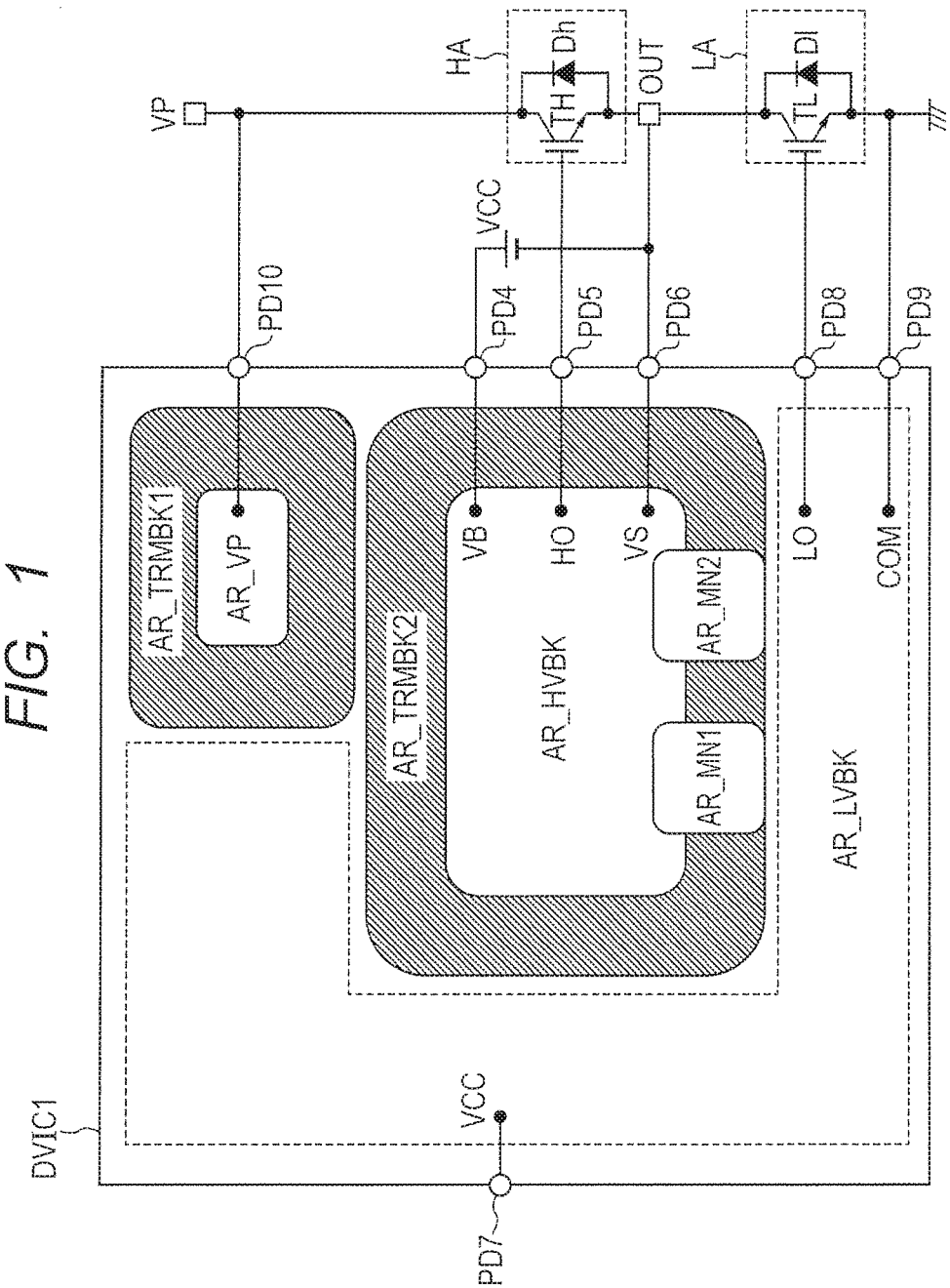
FIG. 1 is a schematic diagram showing a basic configuration example of a main section in a power control device according to an embodiment 1 of the present invention.

The invention will be described by being divided into a plurality of sections or embodiments whenever circumstances require it for convenience in the following embodiments.

However, unless otherwise specified in particular, they are not irrelevant to one another. One thereof has to do with modifications, details, supplementary explanations, etc. of some or all of the other. Also, when reference is made to the number of elements or the like (including the number of pieces, numerical values, quantity, range, etc.) in the following embodiments, the number thereof is not limited to a specific number and may be greater than or less than or equal to the specific number except for where otherwise specified in particular and definitely limited to the specific number in principle, etc.

It is further needless to say that in the following embodiments, components (also including element steps, etc.) employed therein are not always essential except for where otherwise specified in particular and considered to be definitely essential in principle, etc. Similarly, when reference is made to the shapes, positional relations and the like of the components or the like in the following embodiments, they will include ones substantially analogous or similar to their shapes or the like except for where otherwise specified in particular and considered not to be definitely so in principle, etc. This is similarly applied even to the above-described numerical values and range.

Moreover, in the embodiments, a MOSFET (Metal Oxide Semiconductor Field Effect Transistor) (abbreviated as a MOS transistor) is used as one example of a MISFET (Metal Insulator Semiconductor Field Effect Transistor), but a non-oxide film is not excluded as a gate insulating film. Besides, in the embodiments, an n channel type MOSFET is referred to as an NMOS transistor, and a p channel type MOSFET is referred to as a PMOS transistor.

Embodiments of the present invention will hereinafter be described in detail based on the accompanying drawings. Incidentally, in all of the drawings for explaining the embodiments, the same reference numerals are respectively attached to the same components in principle, and their repetitive description will be omitted.

Embodiment 1

Outlines and Problems Around Power Control Device (Comparative Example)

Figure 16:
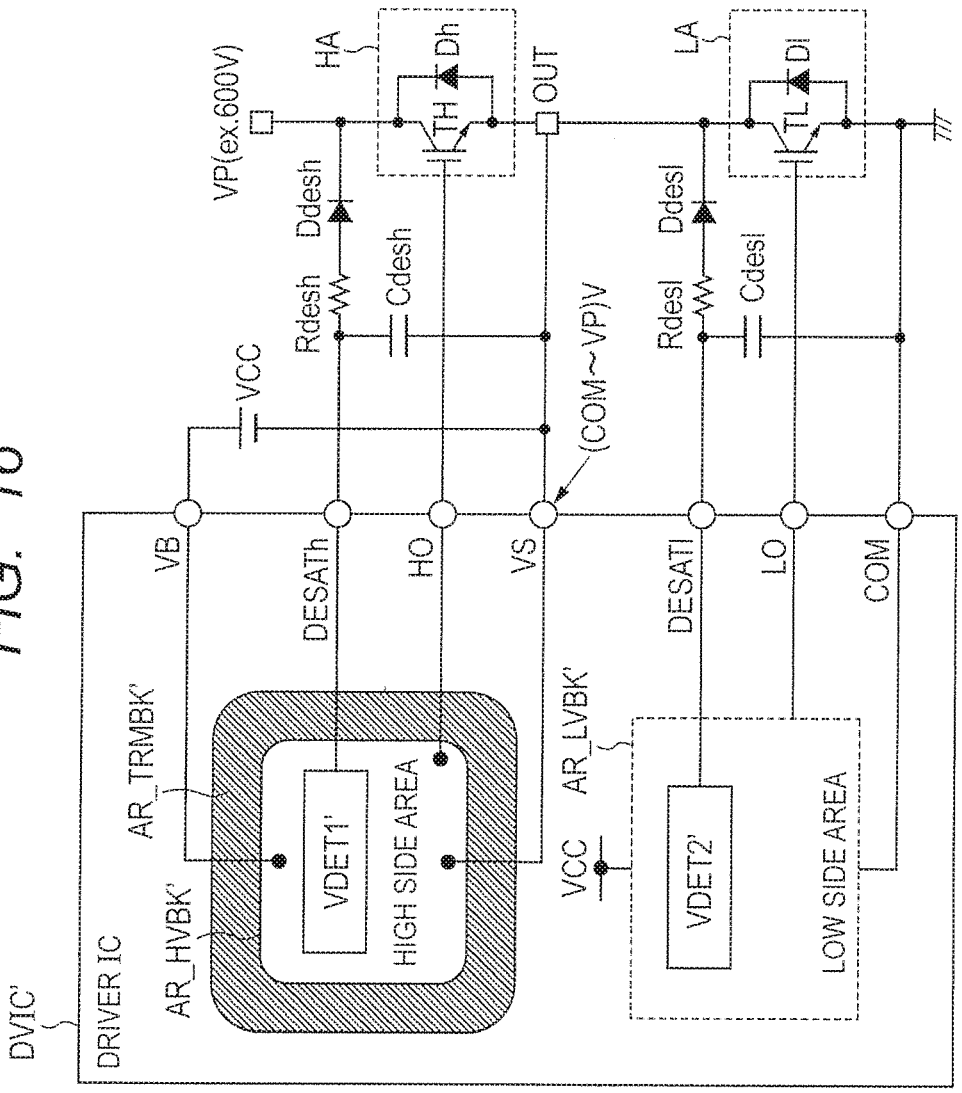
FIG. 16 is a schematic diagram showing a configuration example of a power control device illustrating a comparative example of the present invention.

A power control device to be a comparative example will first be described prior to the description of a power control device according to an embodiment 1. FIG. 16 is a schematic diagram showing a configuration example of a power control device to be a comparative example of the present invention. The power control device shown in FIG. 16 is equipped with diodes Ddesh and Ddesl, resistors Rdesh and Rdeshl, and capacitors Cdesh and Cdeshl, etc. which serve as external parts of the driver IC, in addition to a driver IC (semiconductor device) (DVIC'), a high side arm HA, and a low side arm (LA).

The high side arm HA is equipped with a high side transistor (IGBT herein) TH and a free wheeling diode Dh and coupled between a high potential side power supply voltage VP and a load drive pin OUT. The low side arm LA is equipped with a low side transistor (IGBT herein) TL and a free wheeling diode D1 and coupled between the load drive pin OUT and a low potential side power supply voltage COM. A voltage value of the high potential side power supply voltage VP becomes a value of 150V or higher, preferably a value of 300V or higher on the basis of the low potential side power supply voltage COM. The voltage value of the high potential side power supply voltage VP is typically 600V or the like, but a value exceeding 1000V may be used in some cases.

The driver IC (DVIC') is comprised of one semiconductor chip and called HVIC (High Voltage IC) or the like. The driver IC (DVIC') is equipped with a high side area AR_HVBK', a low side area AR_LVBK', and a termination area AR_TRMBK' which absorbs a difference in potential between the two areas. A circuit operated at a power supply voltage VCC (e.g., 10V or 15V or the like) on the basis of the low potential side power supply voltage COM is formed in the low side area AR_LVBK'. Specifically, there are formed therein a low side driver which drives the low side transistor TL, a voltage detection circuit VDET2' which detects a collector-emitter voltage of the low side transistor TL, etc.

A circuit operated at a boot power supply voltage VB (VB=VS+VCC) on the basis of a voltage (floating voltage VS) at the load drive pin OUT is formed in the high side area AR_HVBK'. Specifically, there are formed therein a high side driver which drives the high side transistor TH, and a voltage detection circuit VDET1' which detects a collector-emitter voltage of the high side transistor TH, etc. The voltage detection circuits VDET1' and VDET2' respectively detect collector-emitter voltages through detection terminals DESATh and DESATl during on periods of target transistors and determine a state in which the corresponding voltages are larger than a predetermined reference voltage (e.g., 7V or the like) to be an overcurrent state.

Here, the floating voltage VS (i.e., emitter voltage of high side transistor TH and collector voltage of low side transistor TL) is shifted between the low potential side power supply voltage COM and the high potential side power supply voltage VP according to the on/off of each transistor (TH, TL). Further, when such a potential difference as to greatly exceed, for example, a power supply voltage VCC level occurs between the voltage detection circuits VDET1' and VDET2', element destruction may occur. Thus, the collector voltage of the high side transistor TH is coupled to the voltage detection circuit VDET1' through the backward diode Ddesh and the like. The collector voltage of the low side transistor TL is coupled to the voltage detection circuit VDET2' through the backward diode Ddesl and the like.

There is however a fear that due to an increase in the number of parts with the external parts (diodes Ddesh and Ddesl, resistors Rdesh and Rdesl, and capacitors Cdesh and Cdesl), the enlargement of a system including the driver IC (DVIC'), an increase in cost, etc. are caused. Further, when the system is of an inverter system or the like including a three-phase (u, v, w phase) half bridge circuit, the number of parts is further increased and problems such as upsizing, an increase in cost, etc. may occur more remarkably.

Basic Configuration of Power Control Device (Embodiment 1)

FIG. 1 is a schematic diagram showing a basic configuration example of a main section in the power control device according to the embodiment 1 of the present invention. The power control device shown in FIG. 1 is equipped with a driver IC (semiconductor device) (DVIC1), a high side arm HA, and a low side arm LA. As with the case of FIG. 16, the high side arm HA is equipped with a high side transistor TH and a free wheeling diode Dh and coupled between a high potential side power supply voltage VP and a load drive pin OUT (in other words, floating voltage VS). The low side arm LA is equipped with a low side transistor TL, and a free wheeling diode Dl and coupled between the load drive pin OUT and a low potential side power supply voltage COM. Although the high side transistor TH and the low side transistor TL are taken for example where they are of IGBTs, they may be high breakdown voltage elements such as a high breakdown voltage MOSFET, a high breakdown voltage bipolar transistor, etc.

The driver IC (semiconductor device) (DVIC1) is equipped with a plurality of pads PD4 through PD9, a power supply application area AR_VP, a high side area AR_HVBK, a low side area AR_LVBK, and two termination areas AR_TRMBK1 and AR_TRMBK2. A pad PD10 is a high potential side power supply pad coupled to the high potential side power supply voltage VP. The pad PD6 is a floating pad coupled to the floating voltage VS. The pad PD9 is a low potential side power supply pad coupled to the low potential side power supply voltage COM.

The pad PD7 is coupled to a power supply voltage VCC of, for example, 15V or the like. The pad PD4 is coupled to a boot power supply voltage VB (VB=VS+VCC). The pad PD5 is a pad which outputs a high side output signal HO to be a gate drive signal of the high side transistor TH. The pad PD8 is a pad which outputs a low side output signal LO to be a gate drive signal of the low side transistor TL.

A high potential side power supply voltage VP of, for example, 600V or the like is applied to the power supply application area AR_VP through the pad PD10. The high side area AR_HVBK is supplied with the boot power supply voltage VB and the floating voltage VS through the pads PD4 and PD6 and formed with a circuit operated at the boot power supply voltage VB on the basis of the floating voltage VS with a high side driver (not shown) generating a high side output signal HO as a representative. The low side area AR_LVBK is supplied with the power supply voltage VCC and the low potential side power supply voltage COM (e.g., ground power supply voltage of 0V) through the pads PD7 and PD9 and formed with a circuit operated at the power supply voltage VCC on the basis of the low potential side power supply voltage COM with a low side driver (not shown) generating a low side output signal LO as a representative.

The termination area AR_TRMBK1 is disposed in a ring form so as to surround the power supply application area AR_VP and absorbs a difference in potential between the power supply application area AR_VP and the low side area AR_LVBK. The termination area AR_TRMBK2 is disposed in a ring form so as to surround the high side area AR_HVBK and absorbs a difference in potential between the high side area AR_HVBK and the low side area AR_LVBK. Further, the termination area AR_TRMBK2 is provided with forming areas AR_MN1 and AR_MN2 of level shift transistors. The level shift transistors respectively convert signals generated in the low side area AR_LVBK and based on the low potential side power supply voltage COM into signals based on the floating voltage VS and output the same to the high side area AR_HVBK.

Thus, the driver IC (DVIC1) of FIG. 1 is equipped with the power supply application area AR_VP and the termination area AR_TRMBK1 in addition to the high side area AR_HVBK and the termination area AR_TRMBK2. Consequently, the high potential side power supply voltage VP (i.e., collector voltage of high side transistor TH) can be coupled to the driver IC (DVIC1) even without using the diode Ddesh and the like such as shown in FIG. 16. As a result, it is possible to reduce the number of parts in a system including the driver IC and achieve miniaturization of the system, a reduction in cost, etc.

Incidentally, although the details of the driver IC (DVIC1) will be described later, the driver IC is capable of monitoring the collector-emitter voltage of the high side transistor TH using the high potential side power supply voltage VP. Further, the driver IC (DVIC1) is also capable of monitoring (i.e., monitoring that the supply of power is normally performed on the half bridge circuit) the high potential side power supply voltage VP itself. With these as a representative, it is possible to cause the driver IC (DVIC1) to perform various processing using the high potential side power supply voltage VP without increasing the number of parts by using the configuration example of FIG. 1.

<<Circuit Configuration and Circuit Operation of Semiconductor Device>>

Figure 2:
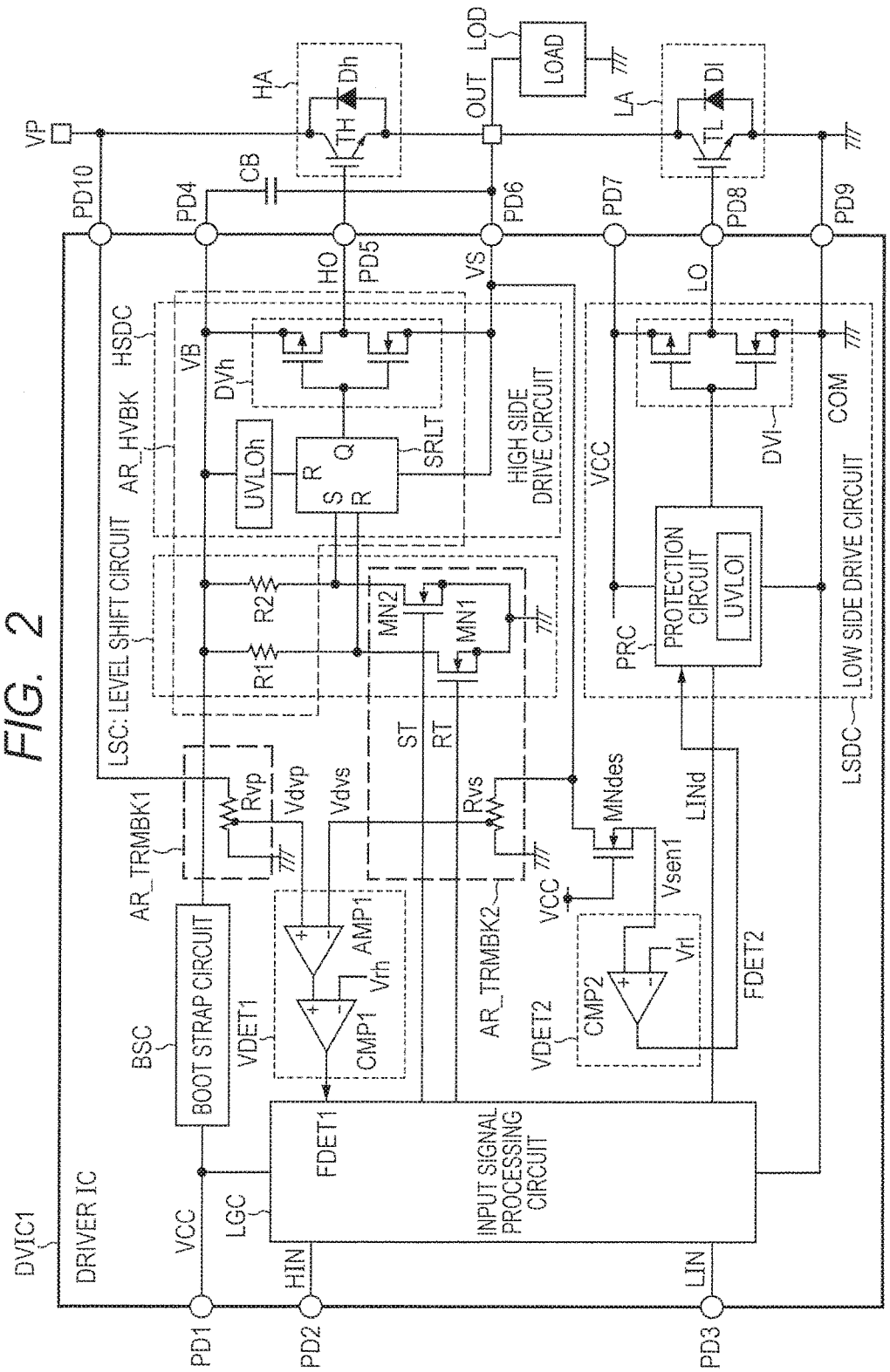
FIG. 2 is a circuit block diagram showing a schematic configuration example including a peripheral section, of a semiconductor device according to the embodiment 1 of the present invention.
Figure 3:
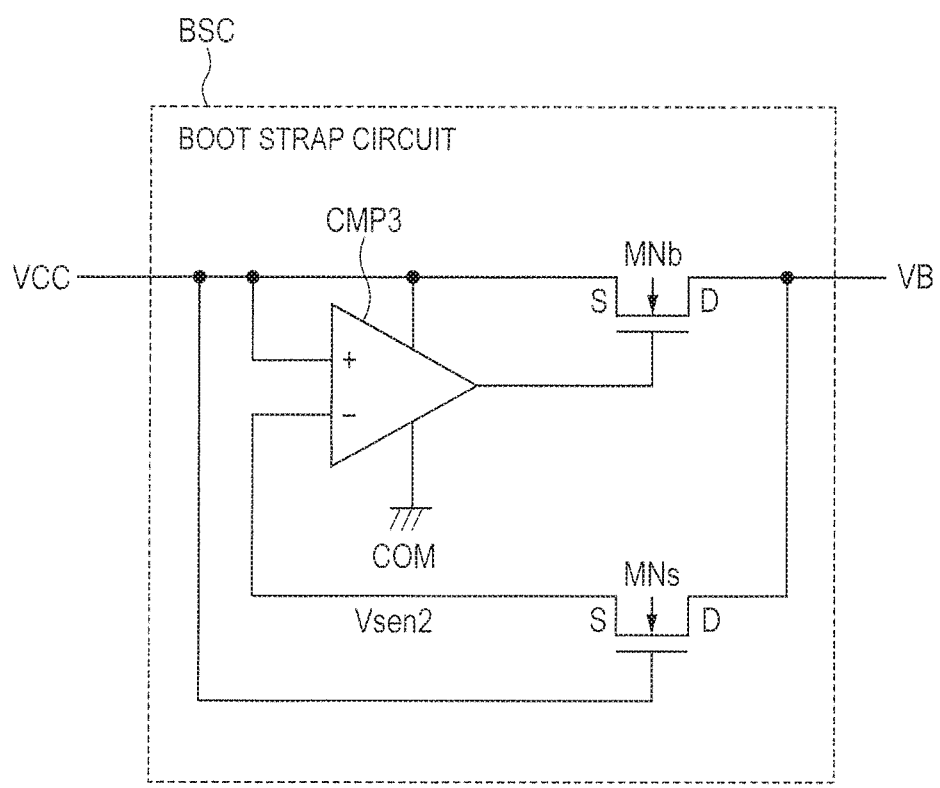
FIG. 3 is a circuit diagram showing a configuration example of a boot strap circuit in FIG. 2.

FIG. 2 is a circuit block diagram showing a schematic configuration example including a peripheral section, of the semiconductor device according to the embodiment 1 of the present invention. FIG. 3 is a circuit diagram showing a configuration example of a boot strap circuit in FIG. 2. The driver IC (semiconductor device) DVIC1 shown in FIG. 2 is comprised of one semiconductor chip and equipped with a plurality of pads PD1 through PD10, an input signal processing circuit LGC, a boot strap circuit BSC, a level shift circuit LSC, a high side drive circuit HSDC, and a low side drive circuit LSDC. In addition, the driver IC (DVIC1) is equipped with resistive elements Rvp and Rvs, an NMOS transistor MNdes, and voltage detection circuits VDET1 and VDET2.

Further, in addition to the driver IC (DVIC1), there are shown here a configuration example of a power control device including a high side arm HA, a low side arm LA, and a boot strap capacitor CB provided thereoutside, and a configuration example of an electronic system including a load circuit LOD. The high side arm HA, the low side arm LA, and the pads PD4 through PD10 are similar to those in FIG. 1.

The pad PD1 is coupled to a power supply voltage VCC together with the pad PD7. The pad PD1 may be made common to the pad PD7. The pad PD2 is inputted with a high side input signal HIN, and the pad PD3 is inputted with a low side input signal LIN. The high side input signal HIN and the low side input signal LIN are generated by, for example, an unillustrated micon (MCU: Micro Control Unit) or the like. As described in FIG. 1, the pad PD6 is a floating pad and is coupled to a floating voltage VS and coupled to a load drive pin OUT. The load circuit LOD is coupled to the load drive pin OUT. The boot strap capacitor CB is provided between the pad PD4 and the pad PD6.

In response to the high side input signal HIN, the input signal processing circuit LGC generates a set signal ST at one of its rising edge and falling edge and generates a reset signal RT at the other thereof. The set signal ST and the reset signal RT are respectively a one-shot pulse signal, for example. Further, in response to the low side input signal LIN, the input signal processing circuit LGC adds a delay corresponding to a dead time to the same and outputs a post-delay low side input signal LINd.

The high side drive circuit HSDC is operated at a boot power supply voltage VB of the pad PD4 on the basis of the floating voltage VS of the pad PD6 and equipped with a high side driver DVh, an SR latch circuit SRLT, and a high side low voltage detection circuit UVLOh. The high side driver DVh is comprised of a CMOS inverter or the like with an output signal (Q) of the SR latch circuit SRLT as its input and outputs a high side output signal HO to the pad PD5 to drive a high side transistor TH.

The SR latch circuit SRLT controls the high side output signal HO via the high side driver DVh according to a set input (S) and a reset input (R). Specifically, the SR latch circuit SRLT controls the high side output signal HO to a boot power supply voltage VB level according to the set input (S) and controls the high side output signal HO to a floating voltage VS level according to the reset input (R). When the value of the boot power supply voltage VB based on the floating voltage VS does not reach a predetermined voltage value, the high side low voltage detection circuit UVLOh performs a reset input (R) to the SR latch circuit SRLT. As a result, the high side transistor TH is fixed to off until the value of the boot power supply voltage VB reaches the predetermined voltage value.

The level shift circuit LSC is equipped with two NMOS transistors MN1 and MN2 and two resistive elements R1 and R2. In the specification, the NMOS transistors MN1 and MN2 are called level shift transistors. The level shift transistor MN1 has a source coupled to a low potential side power supply voltage COM, and a drain coupled to the pad PD4 through the resistive element R1. The level shift transistor MN2 has a source coupled to the low potential side power supply voltage COM, and a drain coupled to the pad PD4 through the resistive element R2. As a result, the boot power supply voltage VB (=VS+VCC) is applied between the sources and drains of the level shift transistors MN1 and MN2 on the basis of the low potential side power supply voltage COM. Therefore, the level shift transistors MN1 and MN2 are required to be high breakdown voltage elements.

The level shift transistor MN2 causes a predetermined pulse current to flow through the resistive element R2 according to the set signal ST to thereby convert the voltage level of the set signal ST into a voltage level adapted to the set input (S) of the SR latch circuit SRLT. Likewise, the level shift transistor MN1 causes a predetermined pulse current to flow through the resistive element R1 according to the reset signal RT to thereby convert the voltage level of the reset signal RT into a voltage level adapted to the reset input (R) of the SR latch circuit SRLT. Thus, the level shift transistors MN1 and MN2 assume the role of converting the signal based on the low potential side power supply voltage COM into the signal based on the floating voltage VS.

The low side drive circuit LSDC is operated at the power supply voltage VCC on the basis of the low potential side power supply voltage COM and equipped with a low side driver DV1, and a protection circuit PRC including a low side low voltage detection circuit UVLO1. The low side driver DV1 is comprised of a CMOS inverter or the like with an output signal of the protection circuit PRC as its input. The low side driver DV1 outputs a low side output signal LO to the pad PD8 to drive a low side transistor TL.

When the value of the power supply voltage VCC with the low potential side power supply voltage COM as the reference does not reach a predetermined voltage value, the low side low voltage detection circuit UVLO1 controls the low side output signal LO to a low potential side power supply voltage COM level through the low side driver DV1. As a result, the low side transistor TL is fixed to off until the value of the power supply voltage VCC reaches the predetermined voltage value. The protection circuit PRC performs various protection of the low side transistor TL with protection by such a low side low voltage detection circuit UVLO1 as a representative. The protection circuit PRC outputs a post-delay low side input signal LINd to the low side driver DV1 particularly during a period in which a failure is not detected.

As shown in FIG. 3, the boot strap circuit BSC is equipped with two NMOS transistors MNb and MNs and a comparator circuit CMP3 and appropriately performs charging to the boot strap capacitor CB to enable the voltage of the boot strap capacitor CB to be maintained at the power supply voltage VCC. That is, when "the boot power supply voltage VB<the power supply voltage VCC", the boot strap circuit BSC couples the pad PD1 (power supply voltage VCC) to the pad PD4 (boot power supply voltage VB). When "VB>VCC", the boot strap circuit BSC decouples the pad PD1 from the pad PD4. As an element which assumes such a function, there is normally provided a boot strap diode which serves as an external part in series with the boot strap capacitor CB. In the present example, the boot strap circuit BSC which assumes a function equivalent to that of the boot strap diode is provided within a semiconductor chip to achieve a reduction in the number of external parts.

The NMOS transistor MNb has a source and a drain respectively coupled to the power supply voltage VCC and the boot power supply voltage VB, and a gate controlled by the comparator circuit CMP3. The NMOS transistor MNs has a source and a drain respectively coupled to a sense voltage Vsen2 and the boot power supply voltage VB, and a gate coupled to the power supply voltage VCC. The comparator circuit CMP3 is operated at the power supply voltage VCC on the basis of the low potential side power supply voltage COM to control the NMOS transistor MNb to on when the sense voltage Vsen2 is lower than the power supply voltage VCC and control the NMOS transistor MNb to off when the sense voltage Vsen2 is higher than the power supply voltage VCC.

The NMOS transistor MNs has a depletion type configuration, for example and clamps the sense voltage Vsen2 so as not to exceed a "power supply voltage VCC (e.g., 15V)+a threshold voltage of the NMOS transistor MNs". As a result, the comparator circuit CMP3 may be a low breakdown voltage element. On the other hand, the NMOS transistors MNb and MNs are required to be high breakdown voltage elements.

In FIG. 2, both ends of the resistive element Rvp are respectively coupled to the low potential side power supply voltage COM and the high potential side power supply voltage VP. Both ends of the resistive element Rvs are respectively coupled to the low potential side power supply voltage COM and the floating voltage VS. The voltage detection circuit VDET1 is equipped with, for example, an amplifier circuit AMP1 and a comparator circuit CMP1. The amplifier circuit AMP1 detects a difference voltage between a voltage Vdvp resistance-divided by the resistive element Rvp and a voltage Vdvs resistance-divided by the resistance element Rvs and amplifies the difference voltage with a predetermined gain, followed by output to the comparator circuit CMP3. When the output voltage of the amplifier circuit AMP1 is larger than a predetermined determination voltage Vrh, the comparator circuit CMP3 outputs a failure detection signal FDET1 to the input signal processing circuit LGC.

That is, the voltage detection circuit VDET1 detects the collector-emitter voltage of the high side transistor TH through the resistive elements Rvp and Rvs to thereby detect an overcurrent flowing through the high side transistor TH.

Though illustration is omitted, the voltage detection circuit VDET1 strictly detects the collector-emitter voltage aiming at an on period of the high side transistor TH and outputs a failure detection signal FDET1. The input signal processing circuit LGC performs a predetermined protection operation according to the failure detection signal FDET1. Typically, the input signal processing circuit LGC forcibly controls the high side transistor TH to off through the set signal ST or the reset signal RT.

The resistive element Rvp and the resistive element Rvs have the same resistance value. The resistance value is set to, for example, a value ranging from a few 10MΩ to a few 100MΩ (typically 100MΩ). The voltage Vdvp is a voltage obtained by resistance-dividing a voltage (i.e., high potential side power supply voltage VP such as 600V) applied across the resistive element Rvp into "1/K". The voltage Vdvs is a voltage obtained by resistance-dividing a voltage (i.e., floating voltage VS changed between 0 and VP) applied across the resistive element Rvs into "1/K" in the same manner. When K=30 or the like, for example, the voltages Vdvp and Vdvs both become a voltage value less than or equal to 20V. As a result, the voltage detection circuit VDET1 can be comprised of a low breakdown voltage element.

The NMOS transistor MNdes has a source and a drain respectively coupled to a sense voltage Vsen1 and the floating voltage VS, and a gate coupled to the power supply voltage VCC. The voltage detection circuit VDET2 is equipped with a comparator circuit CMP2. When the sense voltage Vsen1 is larger than a predetermined determination voltage Vr1 (e.g., 7V or the like), the comparator circuit CMP2 outputs a failure detection signal FDET2 to the protection circuit PRC.

That is, the voltage detection circuit VDET2 detects the collector-emitter voltage of the low side transistor TL through the NMOS transistor MNdes to thereby detect an overcurrent flowing through the low side transistor TL. Though illustration is omitted, the voltage detection circuit VDET2 strictly detects the collector-emitter voltage aiming at an on period of the low side transistor TL and outputs a failure detection signal FDET2. The protection circuit PRC performs a predetermined protection operation according to the failure detection signal FDET2. Typically, the protection circuit PRC forcibly controls the low side transistor TL to off through the low side driver DV1.

Generally, as shown in FIG. 16, the diode Ddesl or the like serving as the external part is provided to detect the floating voltage VS. In the present example, the NMOS transistor MNdes assumes a role equivalent to that of the diode Ddesl or the like, thereby achieving a reduction in the number of external parts. As with the case of the NMOS transistor MNs of FIG. 2, the NMOS transistor MNdes clamps the sense voltage Vsen1 so as not to exceed a "power supply voltage VCC (e.g., 15V)+a threshold voltage of the NMOS transistor MNdes". As a result, the voltage detection circuit VDET2 can be comprised of a low breakdown voltage element.

Here, the resistive element Rvp is formed in the termination area AR_TRMBK1 of FIG. 1 though its details will be mentioned later. The high side drive circuit HSDC and the resistive elements R1 and R2 in the level shift circuit LSC are formed in the high side area AR_HVBK of FIG. 1. The level shift transistors MN1 and MN2 in the level shift circuit LSC and the resistive element Rvs are formed in the termination area AR_TRMBK2 of FIG. 1 though their details will be described later. Incidentally, although the NMOS transistor MNdes and the NMOS transistors MNb and MNs in the boot strap circuit BSC are also additionally formed in the termination area AR_TRMBK2, their details will be omitted in the specification. Further, each circuit excluding these is formed in the low side area AR_LVBK of FIG. 1.

Using such a driver IC (DVIC1) as shown in FIG. 2 makes it possible to detect an overcurrent flowing through the high side transistor TH and the low side transistor TL without providing the external diodes Ddesh and Ddesl or the like as compared with the configuration example of FIG. 16. As a result, it is possible to reduce the number of external parts. Further, in terms of the high side transistor TH in particular, the configuration example of FIG. 16 may cause a need to have a level shift for outputting the result of detection by the voltage detection circuit VDET1' to the low side area AR_LVBK'. On the other hand, when such resistive elements Rvp and Rvs as shown in FIG. 2 are used, the voltage detection circuit VDET1 can be directly formed in the low side area AR_LVBK, so that such a level shift becomes unnecessary. As a result, there is a case where the layout configuration in the driver IC can be simplified.

Described specifically, the level shift from the low side area AR_LVBK' to the high side area AR_HVBK' is performed through the NMOS transistors (level shift transistors) MN1 and MN2 as with the case of FIG. 2, but in order to perform a level shift in its reverse direction, PMOS transistors are normally required. Although it is easy to form the NMOS transistors in the termination area AR_TRMBK' of FIG. 16 in an actual layout, there is a case where a complex layout is required to additionally form the PMOS transistors. Even from such a viewpoint, the use of the configuration example of FIG. 2 becomes beneficial.

Incidentally, the resistive elements Rvp and Rvs can also be used in an application different from FIG. 2. For example, a voltage detection circuit which detects the voltage Vdvp on the basis of the low potential side power supply voltage COM is provided and thereby made possible to detect whether the high potential side power supply voltage VP is normally supplied to the half bridge circuit. Further, the voltage detection circuit VDET2 is also capable of detecting the overcurrent flowing through the low side transistor TL by using the voltage Vdvs instead of the sense voltage Vsen1. This case however assumes a detection operation based on a single system using only the resistive element Rvs other than a differential system using the resistive elements Rvp and Rvs as on the high side. Therefore, the resistive element Rvs may be required to have a certain degree of accuracy. In light of this, the sense voltage Vsen1 is preferably used.

Figure 4:
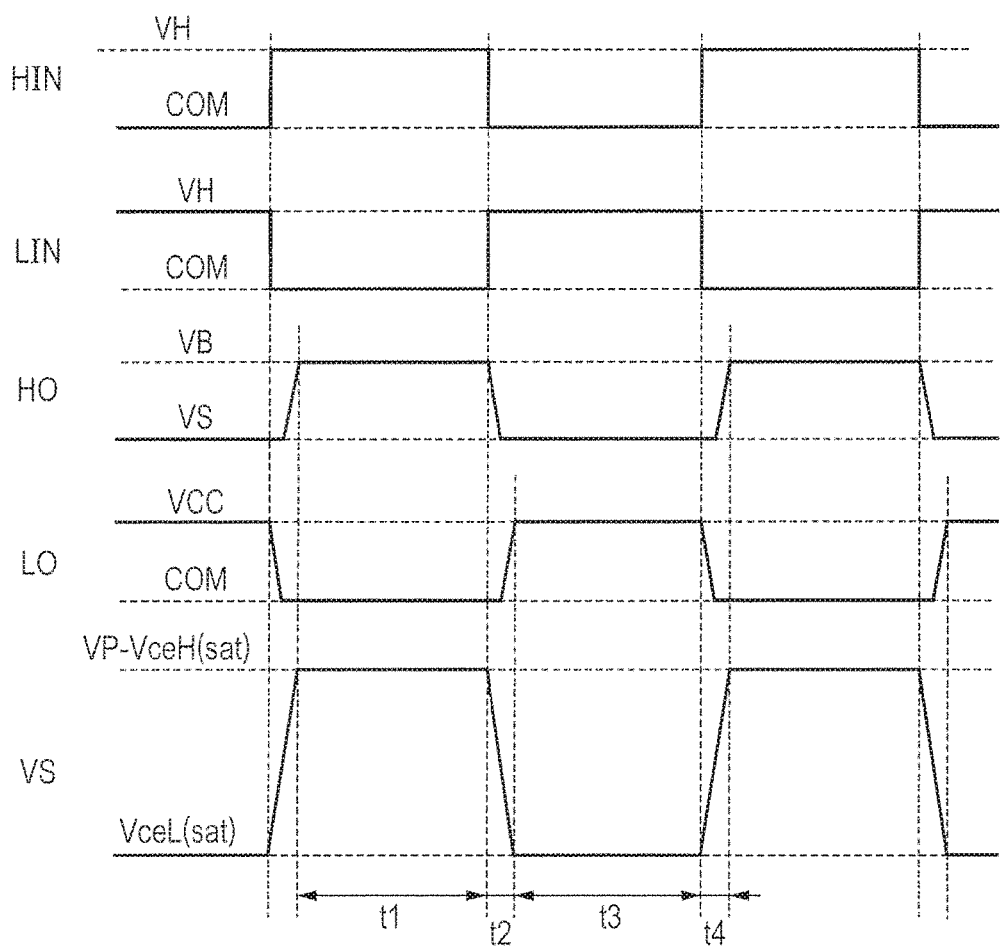
FIG. 4 is a waveform diagram showing one example of a schematic input/output operation in the semiconductor device of FIG. 2.

FIG. 4 is a waveform diagram showing one example of a schematic input/output operation in the semiconductor device of FIG. 2. Assume here where the high side input signal HIN and the low side input signal LIN are complementarily inputted. Each of the high side input signal HIN and the low side input signal LIN is shifted with, for example, its 'L' level as a low potential side power supply voltage COM (ground power supply voltage of 0V) and its 'H' level as a high potential side voltage VH (e.g., 5V or the like).

The driver IC (semiconductor device) DVIC1 complementarily outputs the high side output signal HO and the low side output signal LO according to the above input. The high side output signal HO is shifted with its 'L' level as the floating voltage VS and shifted with its 'H' level as the boot power supply voltage VB. The low side output signal LO is shifted with its 'L' level as the low potential side power supply voltage COM and shifted with its 'H' level as the power supply voltage VCC (e.g., 15V or the like). Incidentally, upon the transition of the high side output signal HO and the low side output signal LO, a dead time is appropriately added thereto so as not to cause a period in which they are both turned on.

Here, during a period t1 in which the high side output signal HO becomes the 'H' level (on level) and the low side output signal LO becomes the 'L' level (off level), the floating voltage VS becomes "VP−VceH (sat)". The high potential side power supply voltage VP is, for example, 600V or the like. VceH (sat) is an on voltage between the collector and emitter of the high side transistor TH. In the IGBT, VceH (sat) becomes a low value of 1.5V or the like, for example. On the other hand, during a period t3 in which the high side output signal HO becomes the 'L' level (off level) and the low side output signal LO becomes the 'H' level (on level), the floating voltage VS becomes "VceL (sat)". VceL (sat) is an on voltage (e.g., 1.5V or the like) at the low side transistor TL.

Further, during a period t2 in which the high side output signal HO is shifted to the 'L' level (off level) and the low side output signal LO is shifted to the 'H' level (on level), the floating voltage VS is lowered from "VP−VceH (sat)" to "VceL (sat)". On the other hand, during a period t4 in which the low side output signal LO is shifted to the 'L' level (off level) and the high side output signal HO is shifted to the 'H' level (on level), the floating voltage VS is raised from "VceL (sat)" to "VP−VceH (sat)". Schematically, the boot strap capacitor CB of FIG. 2 is charged to the power supply voltage VCC during the period t3 in which the low side transistor TL is on, and supplies the charged power supply voltage VCC to the high side driver DVh or the like during the period t1 in which the high side transistor TH is on.

<<Layout Configuration Around High Side Area>>

Figure 5:
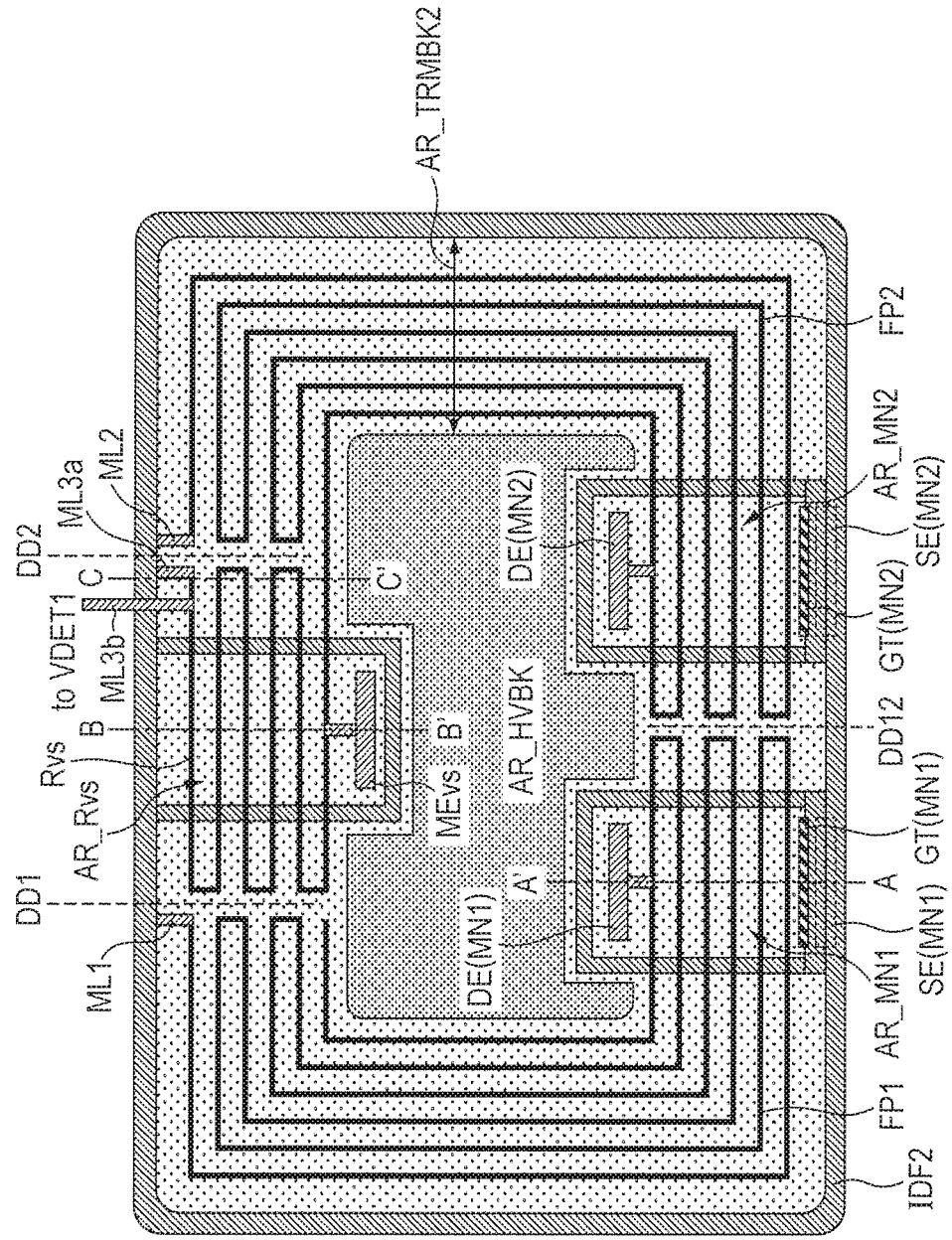
FIG. 5 is a plan diagram showing a detailed layout configuration example of a high side area and its termination area surrounding in FIGS. 1 and 2.

FIG. 5 is a plan diagram showing a detailed layout configuration example of the high side area and its termination area surrounding in FIGS. 1 and 2. In FIG. 5, a termination area AR_TRMBK2 is, for example, an n⁻-type semiconductor region and is disposed in a ring form so as to surround a high side area AR_HVBK. For example, an isolation area IDF2 being a p-type semiconductor region is disposed at a boundary portion between the termination area AR_TRMBK2 and a low side area (not shown). The isolation area IDF2 is disposed along the outer periphery of the termination area AR_TRMBK2 and isolates the termination area AR_TRMBK2 and the low side area (not shown) from each other. The isolation area IDF2 is supplied with a low potential side power supply voltage COM.

There are formed in the termination area AR_TRMBK2, level shift transistors MN1 and MN2, two field plate wirings FP1 and FP2 each comprised of a polysilicon wiring, and a resistive element Rvs comprised of a polysilicon wiring. In the present example, the termination area AR_TRMBK2 is provided with ring-shaped patterns coupled to the isolation area IDF2. Thus, three independent areas are provided therein. Of these, the two serve as forming areas AR_MN1 and AR_MN2 of the level shift transistors MN1 and MN2, and the remaining one serves as an area AR_Rvs for a resistive element Rvs.

A source electrode SE (MN1), a gate layer GT (MN1), and a drain electrode DE (MN1) are disposed in the forming area AR_MN1 of the level shift transistor MN1. Likewise, a source electrode SE (MN2), a gate layer GT (MN2), and a drain electrode DE (MN2) are disposed in the forming area AR_MN2 of the level shift transistor MN2.

The field plate wiring FP1 is disposed in at least the forming area AR_MN1 of the level shift transistor MN1. The field plate wiring FP1 extends along the circumferential direction of the termination area AR_TRMBK2 and extends from the inner peripheral side of the termination area AR_TRMBK2 to its outer peripheral side (or from the outer peripheral side to the inner peripheral side) while being turned back at prescribed boundaries DD12 and DD1. Further, the field plate wiring FP1 couples an output node (drain electrode DE (MN1) disposed on the inner peripheral side) of the level shift transistor MN1 and the isolation area IDF2 disposed on the outer peripheral side. At this time, the field plate wiring FP1 is coupled to the isolation area IDF2 through a metal wiring ML1.

Likewise, the field plate wiring FP2 is disposed in at least the forming area AR_MN2 of the level shift transistor MN2. The field plate wiring FP2 extends along the circumferential direction of the termination area AR_TRMBK2 and extends from the inner peripheral side of the termination area AR_TRMBK2 to its outer peripheral side (or from the outer peripheral side to the inner peripheral side) while being turned back at the prescribed boundaries DD12 and DD2. Further, the field plate wiring FP2 couples an output node (drain electrode DE (MN2) disposed on the inner peripheral side) of the level shift transistor MN2 and the isolation area IDF2 disposed on the outer peripheral side. At this time, the field plate wiring FP2 is coupled to the isolation area IDF2 through a metal wiring ML2.

A metal electrode MEvs supplied with a floating voltage VS is disposed in the area AR_Rvs for the resistive element Rvs. The resistive element Rvs (specifically, polysilicon wiring) extends in the circumferential direction of the termination area AR_TRMBK2 and extends from the inner peripheral side of the termination area AR_TRMBK2 to its outer peripheral side (or from the outer peripheral side of the termination area AR_TRMBK2 to the inner peripheral side thereof) while being turned back at the prescribed boundaries DD1 and DD2, in a manner similar to the field plate wirings FP1 and FP2.

Then, the resistive element Rvs couples the metal electrode MEvs (i.e., floating voltage VS) disposed on the inner peripheral side and the isolation area IDF2 (i.e., low potential side power supply voltage COM) disposed on the outer peripheral side. At this time, the resistive element Rvs is coupled to the isolation area IDF2 through a metal wiring ML3a. Further, one end of a metal wiring ML3b is coupled to a spot close to the end on the low potential side power supply voltage COM side, of the resistive element Rvs. The other end of the metal wiring ML3b is coupled to the voltage detection circuit VDET1 shown in FIG. 2.

<<Layout Configuration Around Power Supply Application Area>>

Figure 6:
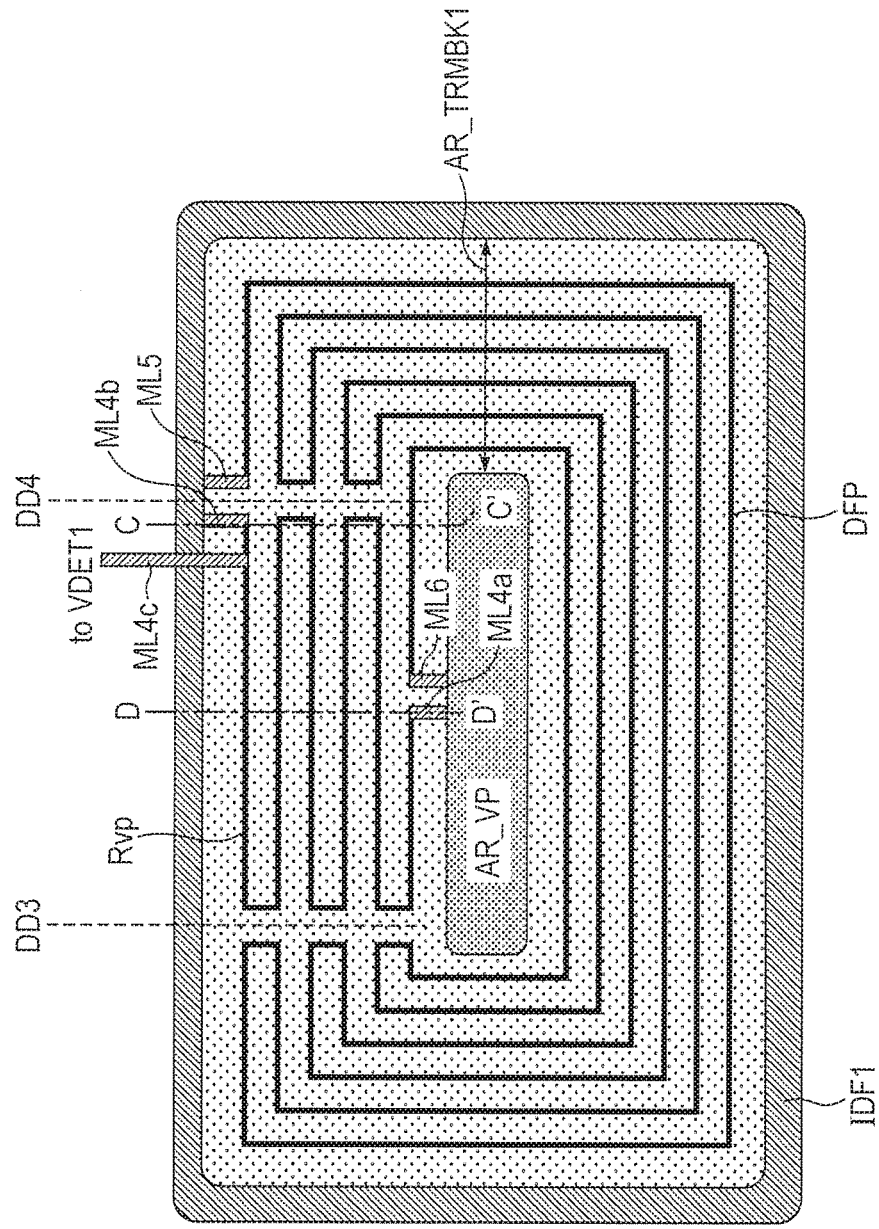
FIG. 6 is a plan diagram showing a detailed layout configuration example of a power supply application area and its termination area surrounding in FIGS. 1 and 2.

FIG. 6 is s plan diagram showing a detailed layout configuration example of the power supply application area and its termination area surrounding in FIGS. 1 and 2. In FIG. 6, a termination area AR_TRMBK1 is, for example, an n⁻-type semiconductor region and is disposed in a ring form so as to surround a power supply application area AR_VP. For example, an isolation area IDF1 being a p-type semiconductor region is disposed at a boundary portion between the termination area AR_TRMBK1 and a low side area (not shown). The isolation area IDF1 is disposed along the outer periphery of the termination area AR_TRMBK1 and isolates the termination area AR_TRMBK1 and the low side area (not shown) from each other. The isolation area IDF1 is supplied with a low potential side power supply voltage COM.

A resistive element Rvp comprised of a polysilicon wiring and a dummy field plate wiring DFP comprised of a polysilicon wiring are formed in the termination area AR_TRMBK1. As with the case of the resistive element Rvs, the resistive element Rvp extends along the circumferential direction of the termination area AR_TRMBK1 and extends from the inner peripheral side of the termination area AR_TRMBK1 to its outer peripheral side (or from the outer peripheral side to the inner peripheral side) while being turned back at prescribed boundaries DD3 and DD4.

Then, the resistive element Rvp couples the power supply application area AR_VP (i.e., high potential side power supply voltage VP) disposed on the inner peripheral side and the isolation area IDF1 (i.e., low potential side power supply voltage COM) disposed on the outer peripheral side. At this time, the resistive element Rvp is coupled to the power supply application area AR_VP through a metal wiring ML4a and coupled to the isolation area IDF1 through a metal wiring ML4b. Further, one end of a metal wiring ML4c is coupled to a spot close to the end on the low potential side power supply voltage COM side, of the resistive element Rvp. The other end of the metal wiring ML4c is coupled to the voltage detection circuit VDET1 shown in FIG. 2.

The dummy field plate wiring DFP extends along the circumferential direction of the termination area AR_TRMBK1 and extends between the inner peripheral side of the termination area AR_TRMBK1 and its outer peripheral side while being turned back at the prescribed boundaries DD3 and DD4, as with the resistive element Rvp. In the dummy field plate wiring DFP, one end thereof on its inner peripheral side is coupled to the power supply application area AR_VP through a metal wiring ML6, and the other end thereof on its outer peripheral side is coupled to the isolation area IDF1 through a metal wiring ML5.

Here, the resistive element Rvp of FIG. 6 has a configuration similar to that of the resistive element Rvs of FIG. 5 inclusive of a wiring length and a wiring width. Further, a coupling point of the resistive element Rvp and the metal wiring ML4c in FIG. 6 is provided at a position similar to a coupling point of the resistive element Rvs and the metal wiring ML3b in FIG. 5. The dummy field plate wiring DFP is provided to make processing conditions for the resistive element Rvp and the resistive element Rvs equivalent to each other inclusive of a step in a film thickness direction, etc. From these results, the resistive elements Rvp and Rvs formed within the same semiconductor chip are assumed to be almost the same voltage division resistor.

On the other hand, there is such a case where between semiconductor chips, for example, a resistive element Rvp of a certain semiconductor chip and a resistive element Rvp of another semiconductor chip are hard to be assumed as the same voltage division resistor with a dispersion in manufacture. In this case, a variation in voltage detection accuracy may occur between the semiconductor chips. Therefore, the voltage detection circuit VDET1 of FIG. 2 detects a voltage by the differential system using the resistive elements Rvp and Rvs in the same semiconductor chip. As a result, even in the case where the dispersion in manufacture between such semiconductor chips occurs, the variation in the voltage detection accuracy between the semiconductor chips can be suppressed.

<<Device Structure of Level Shift Transistor>>

Figure 7:
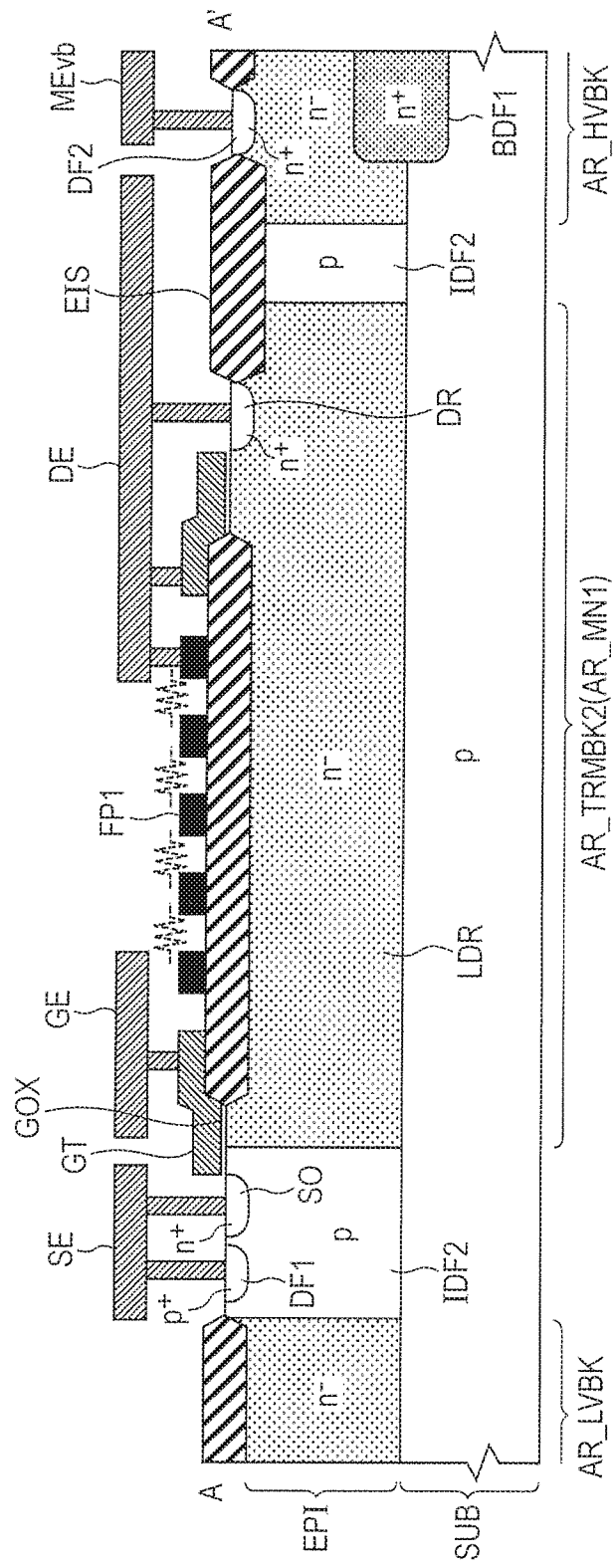
FIG. 7 is a sectional diagram showing a schematic structure example of a level shift transistor (between A-A') in FIG. 5.

FIG. 7 is a sectional diagram showing a schematic structure example of the level shift transistor (between line A-A') in FIG. 5. In FIG. 7, an n⁻-type epitaxial layer EPI lower in impurity concentration than an n-type is disposed over a p-type semiconductor substrate SUB. The epitaxial layer EPI is separated by a p-type isolation area IDF2 extending so as to be coupled to the semiconductor substrate SUB from the main surface (in other words, element forming surface) side. The thus-separated one epitaxial layer EPI becomes a drift layer LDR and becomes the forming area AR_MN1 of the level shift transistor MN1 shown in FIG. 5.

A p⁺-type diffusion layer DF1 higher in impurity concentration than a p-type, and an n⁺-type source diffusion layer SO higher in impurity concentration than an n-type are disposed on the main surface side of the isolation area IDF2 on the low side area AR_LVBK side. The diffusion layer DF1 and the source diffusion layer SO are both coupled to a source electrode SE comprised of a contact layer and a metal layer. The source electrode SE is coupled to the low potential side power supply voltage COM. A gate layer GT comprised of polysilicon or the like is disposed above the isolation area IDF2 through a gate insulating film GOX between the source diffusion layer SO and the drift layer LDR. A channel region is formed immediately below the gate insulating film GOX in the isolation area IDF2. The gate layer GT is coupled to a gate electrode GE comprised of a contact layer and a metal layer.

On the main surface side of the drift layer LDR, an n⁺-type drain diffusion layer DR is disposed on the side near the high side area AR_HVBK. The n⁺-type drain diffusion layer DR is coupled to a drain electrode DE comprised of a contact layer and a metal layer. Though illustration is omitted, the drain electrode DE is coupled to the boot power supply voltage VB through the resistive element R1 of FIG. 2 formed in the high side area AR_HVBK.

On the main surface side of the drift layer LDR, an insulating film EIS is formed between the drain diffusion layer DR and the channel region. As described in FIG. 5, a field plate wiring FP1 which serves as a polysilicon wiring is disposed above the insulating film EIS. One end of the field plate wiring FP1 is coupled to the drain electrode DE, and the other end thereof is coupled to the isolation area IDF2 at an unillustrated spot.

Each circuit formed in the high side area AR_HVBK is formed in the epitaxial layer EPI of the high side area AR_HVBK. A diffusion layer DF2 is formed on the main surface side of the epitaxial layer EPI. The diffusion layer DF2 is coupled to a metal electrode MEvb to which the boot power supply voltage VB is applied. Though illustration is omitted, the metal electrode MEvb extends over the high side area AR_HVBK and performs power supply to each circuit in the high side area AR_HVBK.

Further, a buried diffusion layer BDF1 which extends over the whole surface of the high side area AR_HVBK is provided at a boundary portion between the epitaxial layer EPI in the high side area AR_HVBK and the semiconductor substrate SUB. The buried diffusion layer BDF1 assumes the role of electrically isolating the semiconductor substrate SUB and the high side area AR_HVBK. Incidentally, though illustration is omitted, a p-type well is appropriately formed in the epitaxial layer EPI in the high side area AR_HVBK. An NMOS transistor which configures each circuit in the high side area AR_HVBK is formed in the p-type well. Further, the p-type well is coupled to a floating voltage VS.

Here, the drift layer LDR belongs to a termination area AR_TRMBK2 and assumes the role of absorbing a difference in potential between the high side area AR_HVBK and the low side area AR_LVBK. In the present example, a voltage (e.g., voltage temporarily exceeding 600V) shifted between the floating voltage VS and the boot power supply voltage VB is applied to the drain diffusion layer DR provided on the inner peripheral side of the termination area AR_TRMBK2. The low potential side power supply voltage COM is applied to the isolation area IDF2 provided along the outer periphery of the termination area AR_TRMBK2. The drift layer LDR absorbs the difference in potential therebetween. Further, the isolation area IDF2 isolates the termination area AR_TRMBK2 and the low side area AR_LVBK from each other.

As described above, the field plate wiring FP1 has one end coupled to the drain electrode DE and the other end coupled to the isolation area IDF2 (i.e., low potential side power supply voltage COM). As a result, the voltage of the field plate wiring FP1 is stepwise lowered from the side close to the drain electrode DE to the side close to the source electrode SE. Giving such a voltage gradient enables uniformization of the spread of a diffusion layer formed in the drift layer LDR, etc.

<<Device Structure of Resistive Element>>

Figure 8:
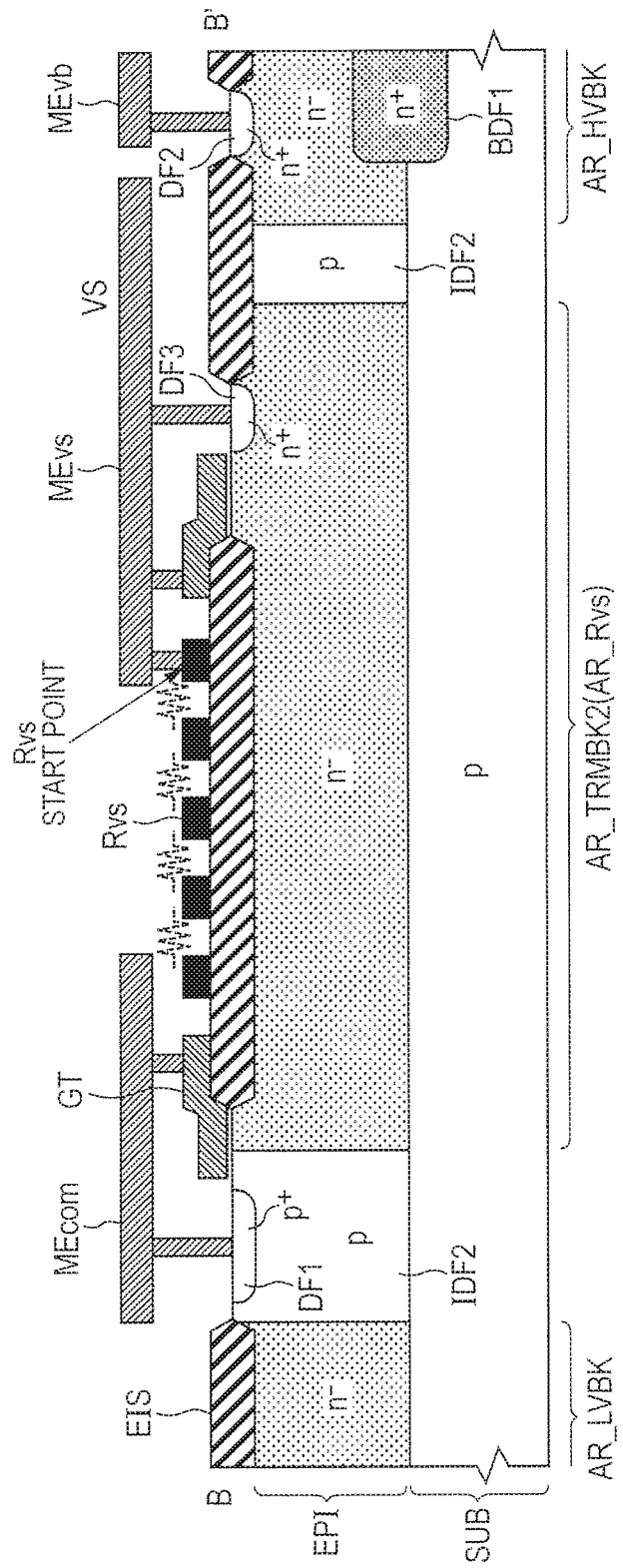
FIG. 8 is a sectional diagram showing a schematic structure example of a resistive element (between B-B') in FIG. 5.

FIG. 8 is a sectional diagram showing a schematic structure example of the resistive element (between line B-B') in FIG. 5. In FIG. 8, an $n^-$-type epitaxial layer EPI is disposed over a p-type semiconductor substrate SUB as with the case of FIG. 7. The epitaxial layer EPI is separated by a p-type isolation area IDF2 which extends from the main surface side so as to be coupled to the semiconductor substrate SUB. The thus-separated one epitaxial layer EPI becomes an area AR_Rvs for the resistive element Rvs shown in FIG. 5.

A $p^+$-type diffusion layer DF1 is disposed on the main surface side of the isolation area IDF2 on the low side area AR_LVBK side. The diffusion layer DF1 is coupled to a metal electrode MEcom to which a low potential side power supply voltage COM is applied. In the present example, a gate layer GT or the like is provided as with the case of FIG. 7. The gate layer GT is coupled to the metal electrode MEcom and becomes a dummy gate which does not serve as the gate of a MOS transistor. The dummy gate or the like is provided to reduce a step between the present structure example and the structure example of FIG. 7.

On the main surface side of the epitaxial layer EPI in the area AR_Rvs, an $n^+$-type diffusion layer DF3 is disposed on the side close to a high side area AR_HVBK. The diffusion layer DF3 is coupled to a metal electrode MEvs to which a floating voltage VS is applied. Though illustration is omitted, the metal electrode MEvs extends over the high side area AR_HVBK and performs power supply to each circuit in the high side area AR_HVBK.

On the main surface side of the epitaxial layer EPI in the area AR_Rvs, an insulating film EIS is formed between the diffusion layer DF3 and the isolation area IDF2 on the low side area AR_LVBK side. As described in FIG. 5, the resistive element Rvs to be a polysilicon wiring is disposed above the insulating film EIS. One end of the resistive element Rvs is coupled to the metal electrode MEvs, and the other end thereof is coupled to the isolation area IDF2 at a spot shown in FIG. 9. Incidentally, the structure of the high side area AR_HVBK is similar to the case of FIG. 7.

Figure 9:
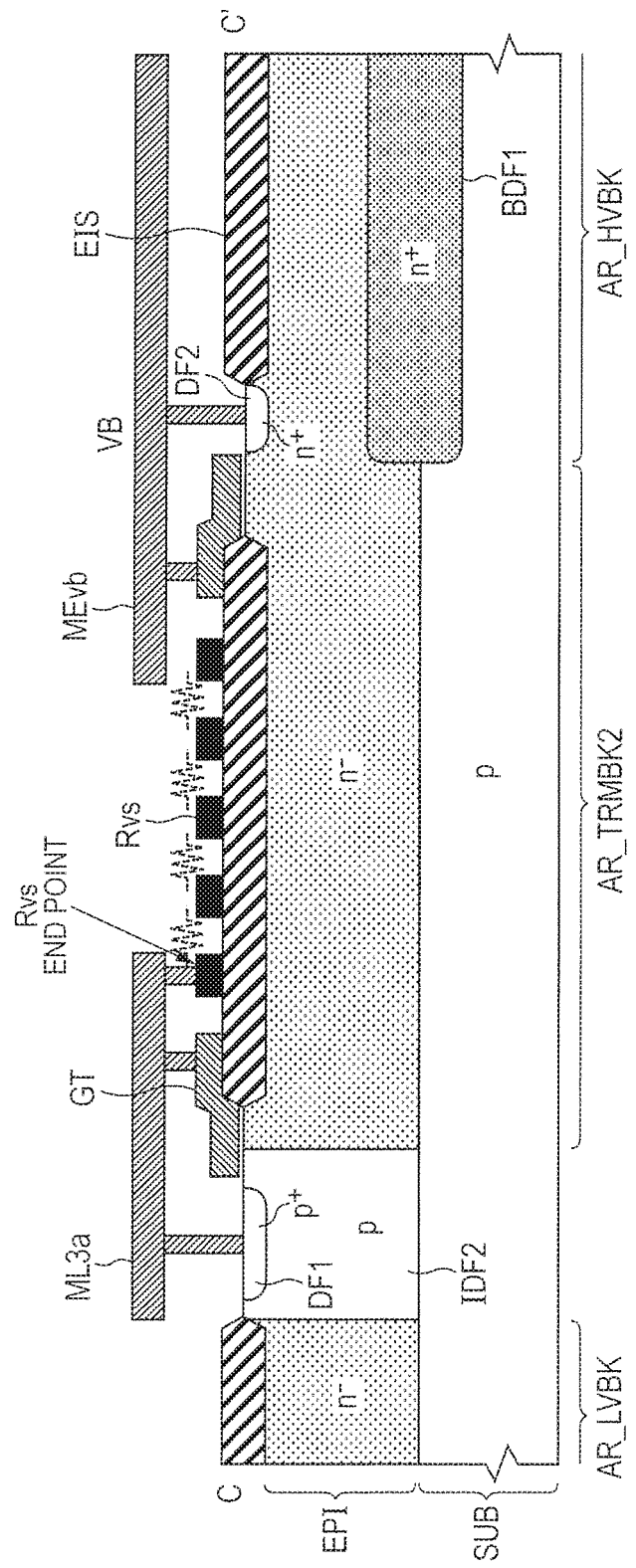
FIG. 9 is a sectional diagram showing a schematic structure example of a resistive element (between C-C') in FIG. 5.

FIG. 9 is a sectional diagram showing a schematic structure example of the resistive element (between line C-C') in FIG. 5. In FIG. 9, as with the cases of FIGS. 7 and 8, an $n^-$-type epitaxial layer EPI is disposed over a p-type semiconductor substrate SUB. The epitaxial layer EPI is separated by a p-type isolation area IDF2 which extends from the main surface side so as to be coupled to the semiconductor substrate SUB. Here, however, unlike the cases of FIGS. 7 and 8, the isolation area IDF2 is not provided on the high side area AR_HVBK side, but provided only on the low side area AR_LVBK side.

A $p^+$-type diffusion layer DF1 is disposed on the main surface side of the isolation area IDF2. The diffusion layer DF1 is coupled to the metal wiring ML3a shown in FIG. 5. Further, even here, a dummy gate (GT) or the like is provided as with the case of FIG. 8. On the main surface side of the epitaxial layer EPI, an $n^+$-type diffusion layer DF2 is disposed at a spot which belongs to the high side area AR_HVBK. The diffusion layer DF2 is coupled to a metal electrode MEvb to which a boot power supply voltage VB is applied. The metal electrode MEvb extends over the high side area AR_HVBK and performs power supply to each circuit in the high side area AR_HVBK.

On the main surface side of the epitaxial layer EPI, an insulating film EIS is formed between the diffusion layer DF2 and the isolation area IDF2. As described in FIG. 5, the resistive element Rvs to be a polysilicon wiring is disposed above the insulating film EIS. One end of the resistive element Rvs is coupled to the metal electrode MEvs as shown in FIG. 8, and the other end thereof is coupled to the isolation area IDF2 (i.e., low potential side power supply voltage COM) through the metal wiring ML3a as shown in FIG. 9. Further, a buried diffusion layer BDF1 similar to the case of FIG. 7 is provided in the high side area AR_HVBK.

Here, as shown in FIGS. 8 and 9, one of the start and end points of the resistive element Rvs becomes a point coupling to the metal electrode MEvs, and the other thereof becomes a point coupling to the metal wiring ML3a. Further, the area AR_Rvs surrounded by the isolation area IDF2 is provided in FIGS. 5 and 8. However, according to circumstances, it is also possible to eliminate the isolation area IDF2 surrounding the area AR_Rvs and in conjunction therewith to eliminate a power supply path for the floating voltage VS through the diffusion layer DF3 of FIG. 8.

That is, as shown in FIG. 8, the resistive element Rvs is formed regardless of the epitaxial layer EPI. There is however a fear that when a large difference in potential occurs between the resistive element Rvs and the epitaxial layer EPI, the insulating film EIS is destructed. Therefore, in FIG. 8, the same floating voltage VS as that for the resistive element Rvs is supplied to the epitaxial layer EPI through the diffusion layer DF3. On the other hand, as shown in FIG. 9, the boot power supply voltage VB is supplied to the epitaxial layer EPI in the area located outside the area AR_Rvs. Since there is nothing but a potential difference of a power supply voltage VCC (e.g., 15V or the like) level between the boot power supply voltage VB and the floating voltage VS, the destruction of the insulating film EIS does not normally occur. Since, however, a voltage of about 15V is always applied to the insulating film EIS in this case, it is desirable to use such a configuration as in each of FIGS. 5 and 8 in this respect.

Figure 10:
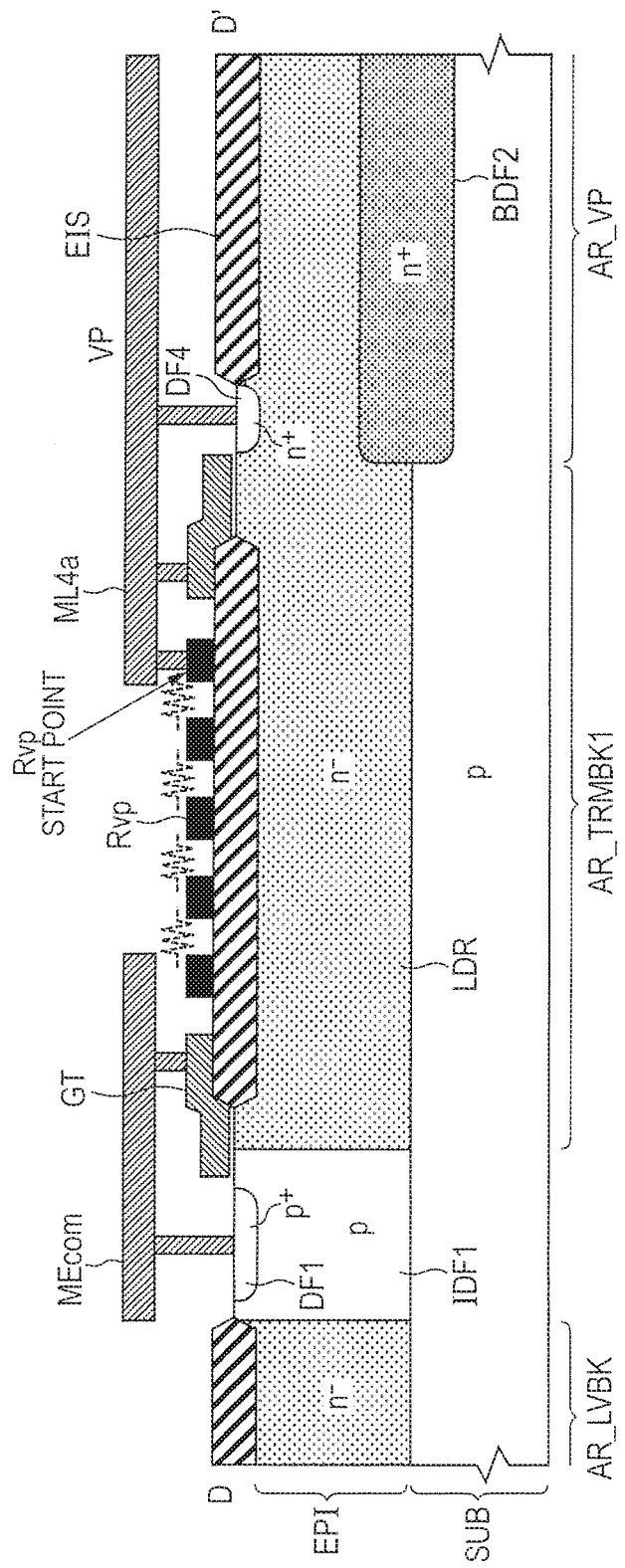
FIG. 10 is a sectional diagram showing a schematic structure example of a resistive element (between D-D') in FIG. 6.

FIG. 10 is a sectional diagram showing a schematic structure example of the resistive element (between line D-D') in FIG. 6. In FIG. 10, as with the case of FIG. 9, an $n^-$-type epitaxial layer EPI is disposed over a p-type semiconductor substrate SUB. The epitaxial layer EPI is separated by a p-type isolation area IDF1 which extends from the main surface side so as to be coupled to the semiconductor substrate SUB. The isolation area IDF1 is provided on the low side area AR_LVBK side.

A $p^+$-type diffusion layer DF1 is disposed on the main surface side of the isolation area IDF1. The diffusion layer DF1 is coupled to a metal electrode MEcom to which a low potential side power supply voltage COM is applied. Further, even here, a dummy gate (GT) or the like is provided as with the case of FIG. 9. On the main surface side of the epitaxial layer EPI, an $n^+$-type diffusion layer DF4 is disposed at a spot which belongs to a power supply application area AR_VP. The diffusion layer DF4 is coupled to the metal wiring ML4a shown in FIG. 6. The metal wiring ML4a extends so as to, for example, cover the power supply application area AR_VP and is applied with a high potential side power supply voltage VP.

On the main surface side of the epitaxial layer EPI, an insulating film EIS is formed between the diffusion layer DF4 and the isolation area IDF1. As described in FIG. 6, the resistive element Rvp to be a polysilicon wiring is disposed above the insulating film EIS. One end of the resistive element Rvp is coupled to the metal wiring ML4a (i.e., high potential side power supply voltage VP) as shown in FIG. 10, and the other end thereof is coupled to the isolation area IDF1 (i.e., low potential side power supply voltage COM) at an unillustrated spot. A structure around the other end thereof is similar to that in FIG. 9 and becomes such a structure as the metal wiring ML3a of FIG. 9 is replaced with the metal wiring ML4b of FIG. 6.

Further, in the power supply application area AR_VP, a buried diffusion layer BDF2 which extends over the whole surface of the power supply application area AR_VP is provided at a boundary portion between the epitaxial layer EPI and the semiconductor substrate SUB. The buried diffusion layer BDF2 assumes the role of electrically isolating the semiconductor substrate SUB and the power supply application area AR_VP from each other. Here, one of the start and end points of the resistive element Rvp becomes a point coupling to the metal wiring ML4a, and the other thereof becomes a point coupling to the metal wiring ML4b.

As described above, it becomes useful to use the termination areas AR_TRMBK1 and AR_TRMBK2 when the resistive elements Rvs and Rvp are formed. As a comparative example, there is considered, for example, a method of directly forming the resistive elements Rvs and Rvp in the low side area AR_LVBK by the polysilicon wiring. In this case, since the voltage of 600V or the like is applied to the resistive elements Rvs and Rvp, there is required a special manufacturing process such as provision of an insulating film having an extremely large film thickness between the polysilicon wiring and the semiconductor substrate (e.g., 0V level), or the like.

Using the termination areas AR_TRMBK1 and AR_TRMBK2 enables the resistive elements Rvs and Rvp to be mounted over a semiconductor chip even without using such a special manufacturing process. Further, as understood from FIGS. 7 through 10, the resistive elements Rvs and Rvp are formed by the same manufacturing process as the process of forming the field plate wirings FP1 and FP2 of the level shift transistors MN1 and MN2. Thus, there is no need of adding a new manufacturing process to form the resistive elements Rvs and Rvp, and a beneficial effect is obtained even from the viewpoint of manufacturing cost or the like.

<<Arrangement Example of Resistive Elements>>

Figure 11:
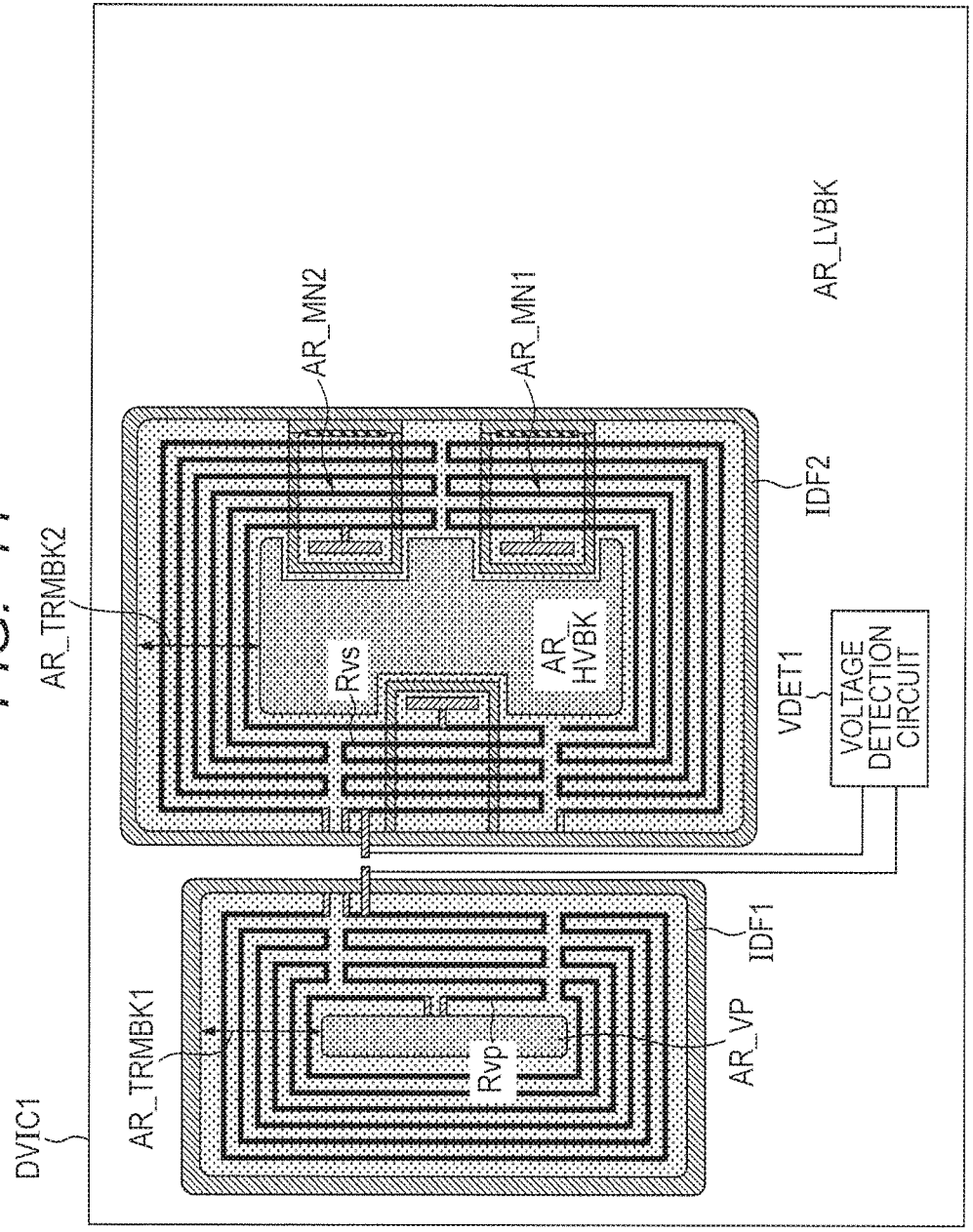
FIG. 11 is a plan diagram showing a schematic layout configuration example of the resistive elements of FIGS. 5 and 6 in a driver IC of FIG. 2.

FIG. 11 is a plan diagram showing a schematic arrangement configuration example of the resistive elements in FIGS. 5 and 6 in the driver IC of FIG. 2. In the example of FIG. 11, termination areas AR_TRMBK1 and AR_TRMBK2 are disposed in such a manner that a resistive element Rvp and a resistive element Rvp are adjacent to each other over a driver IC (semiconductor chip) DVIC1. Further, herein, the resistive element Rvp and the resistive element Rvs are disposed so as to assume a linearly symmetric layout. Respective metal wirings (ML3b and ML4c in FIGS. 5 and 6) drawn from the resistive elements Rvp and Rvs are coupled to a voltage detection circuit VDET1 in a low side area AR_LVBK.

Thus, the identity of the resistive element Rvp and the resistive element Rvs can be ensured with higher accuracy by using the adjacent arrangement and the linearly symmetric layout. Incidentally, in the present example, an isolation area IDF1 and an isolation area IDF2 are disposed adjacent to each other with the low side area AR_LVBK interposed therebetween. According to circumstances, however, at this adjacent spot, the isolation areas IDF1 and IDF2 can also be made common as one and disposed without interposing the low side area AR_LVBK therebetween.

As described above, typically, the number of parts in the system including the driver IC (semiconductor device) can be reduced by using the semiconductor device and the power control device according to the embodiment 1. As a result, it is possible to achieve miniaturization of the system, a reduction in its cost, etc.

Embodiment 2

Schematic Circuit Configuration of Power Control Device (Application Example [1])

Figure 12:
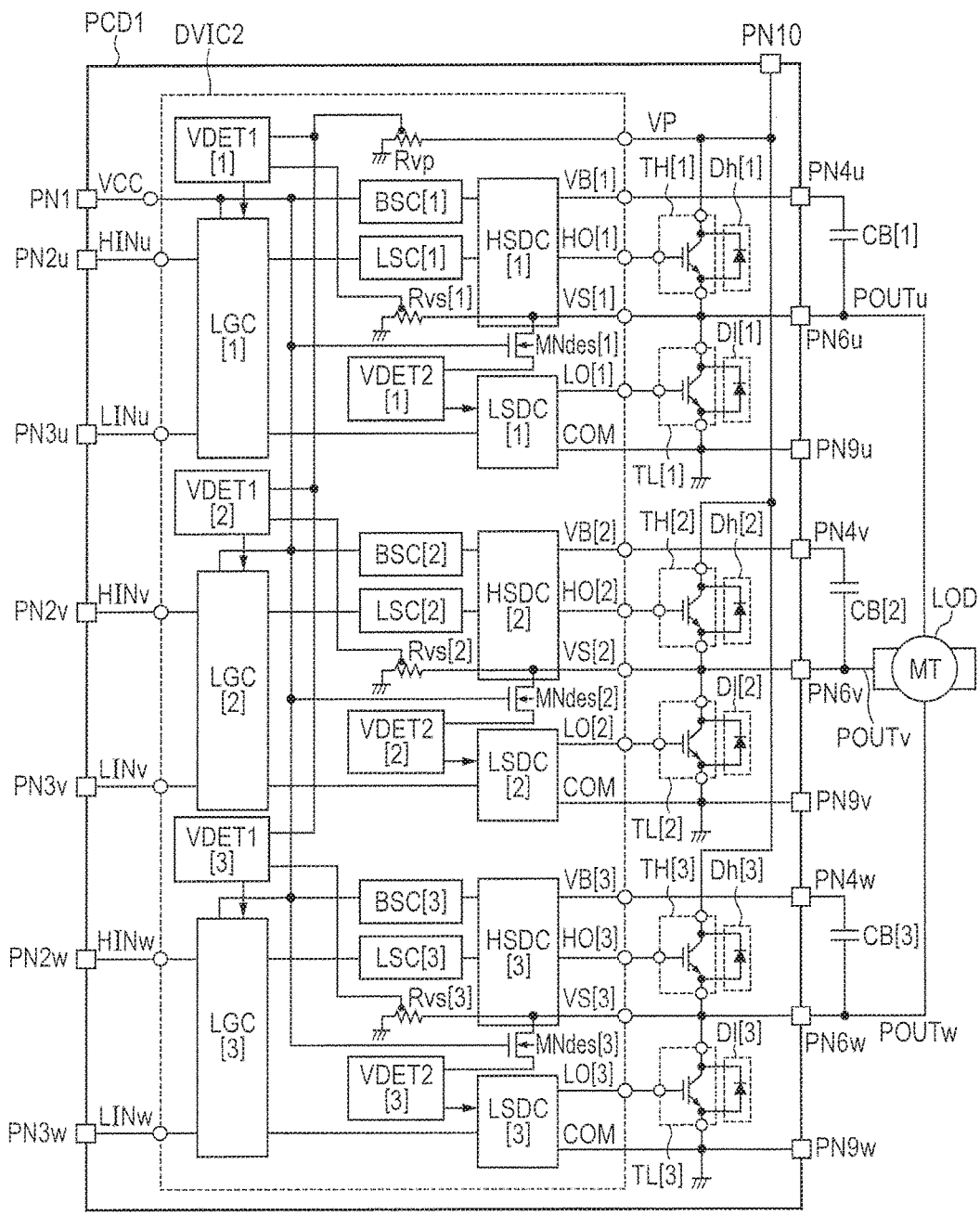
FIG. 12 is a circuit block diagram showing a schematic configuration example including a peripheral section, of a power control device according to an embodiment 2 of the present invention.

FIG. 12 is a circuit block diagram showing a schematic configuration example including a peripheral section, of a power control device according to an embodiment 2 of the present invention. A configuration example of an electronic system including a power control device PCD1 comprised of one package, three boot strap capacitors CB [1] through CB [3] which serve as its external parts, and a load circuit LOD such as a motor MT or the like is shown in FIG. 12. Although not limited in particular, the electronic system is a three-phase inverter system which drives a motor MT of an inverter air conditioner, etc.

The power control device PCD1 is equipped with a plurality of external pins PN1, PN2 (u, v, w) through PN4 (u, v, w), PN6 (u, v, w), PN9 (u, v, w), and PN10. Further, the power control device PCD1 is equipped within a package with a driver IC (semiconductor device) DVIC2, three-phase high side transistors TH [1] through TH [3], three-phase low side transistors TL [1] through TL [3], three-phase high side free wheeling diodes Dh [1] through Dh [3], and three-phase low side free wheeling diodes Dl [1] through Dl [3]. Each transistor (TH [1] through TH [3] and TL [1] through TL [3]) is, for example, an IGBT or the like. Each diode (Dh [1] through Dh [3] and Dl [1] through Dl [3]) is, for example, an FRD (Fast Recovery Diode) or the like.

The external pin (high potential side power supply pin) PN10 is coupled to a high potential side power supply voltage VP of a few hundred V or the like (typically 600V or the like). The external pin PN1 is coupled to a power supply voltage VCC of, for example, 15V or the like. The external pins PN2 (u, v, w) are respectively inputted with high side input signals HIN (u, v, w) of three phases (u, v and w phases). The external pins PN3 (u, v, w) are respectively inputted with three-phase low side input signals LIN (u, v, w).

Likewise, the external pins PN4 (u, v, w) are respectively coupled to boot power supply voltages VB ([1], [2], [3]) of three phases (u, v and w phases). The external pins (load drive pins) PN6 (u, v, w) are respectively coupled to three-phase floating voltages VS ([1], [2], [3]). Further, the external pins PN6 (u, v, w) are coupled even to the load circuit LOD and output three-phase load drive signals POUT (u, v, w) respectively to the load circuit LOD. The external pins (low potential side power supply pins) PN9 (u, v, w) are coupled together to a low potential side power supply voltage COM. The external pins PN9 (u, v, w) may be made common as one.

The boot strap capacitors CB ([1], [2], [3]) are respectively provided between the external pins PN4 (u, v, w) and the external pins PN6 (u, v, w). The high side transistor TH [1] and the high side free wheeling diode Dh [1] configure a u-phase high side arm and are provided between the external pin PN10 and the external pin PN6u. The low side transistor TL [1] and the low side free wheeling diode Dl [1] configure a u-phase low side arm and are provided between the external pin PN6u and the external pin PN9u.

Likewise, the high side transistor TH [2] and the high side free wheeling diode Dh [2] configure a v-phase high side arm and are provided between the external pin PN10 and the external pin PN6v. The low side transistor TL [2] and the low side free wheeling diode Dl [2] configure a v-phase low side arm and are provided between the external pin PN6v and the external pin PN9v. The high side transistor TH [3] and the high side free wheeling diode Dh [3] configure a w-phase high side arm and are provided between the external pin PN10 and the external pin PN6w. The low side transistor TL [3] and the low side free wheeling diode Dl [3] configure a w-phase low side arm and are provided between the external pin PN6w and the external pin PN9w.

The driver IC (semiconductor device) DVIC2 has such a configuration as to have the respective circuit blocks in the driver IC (DVIC1) shown in FIG. 2 for three phases. In other words, the driver IC (DVIC2) is equipped with three-phase drive circuit areas which respectively drive the respective phases of the three-phase (u, v and w-phase) high side transistors and low side transistors. The driver IC (DVIC2) is equipped in the three-phase drive circuit areas respectively with high side drive circuits HSDC ([1], [2], [3]), low side drive circuits LSDC ([1], [2], [3]), level shift circuits LSC ([1], [2], [3]), input signal processing circuits LGC ([1], [2], [3]), and boot strap circuits BSC ([1], [2], [3]).

Besides, the driver IC (DVIC2) is equipped in the three-phase driver circuit areas respectively with resistive elements Rvs ([1], [2], [3]), NMOS transistors MNdes ([1], [2], [3]), and voltage detection circuits VDET1 ([1], [2], [3]) and VDET2 ([1], [2], [3]). Further, the driver IC (DVIC2) is equipped with a circuit area common to the three phases in addition to the drive circuit areas for every three phases. A resistive element Rvp is formed in the three-phase common circuit area. The voltage detection circuits VDET1 ([1], [2], [3]) respectively have one inputs coupled together to the resistive element Rvp, and the other inputs respectively coupled to resistive elements Rvs ([1], [2], [3]).

For example, in the u-phase drive circuit area, the pads PD2 through PD4, PD6, and PD9 shown in FIG. 2 are respectively coupled to the external pins PD2u through PD4u, PD6u, and PD9u. The pad PD5 shown in FIG. 2 is coupled to a gate of the high side transistor TH [1] and outputs a u-phase high side output signal HO [1]. The pad PD8 shown in FIG. 2 is coupled to a gate of the low side transistor TL [1] and outputs a u-phase low side output signal LO [1].

Likewise, even in the respective drive circuit areas of the v and w phases, the pad of each phase is coupled its corresponding external pin and a gate of its corresponding transistor. Further, as pads common to each phase, the pads PD1 (and PD7) of FIG. 2 applied with the power supply voltage VCC are coupled to the external pin PN1 of FIG. 12, and the pad PD10 of FIG. 2 applied with the high potential side power supply voltage VP is coupled to the external pin PN10 in FIG. 12.

Schematic Layout Configuration of Semiconductor Device (Application Example [1])

Figure 13:
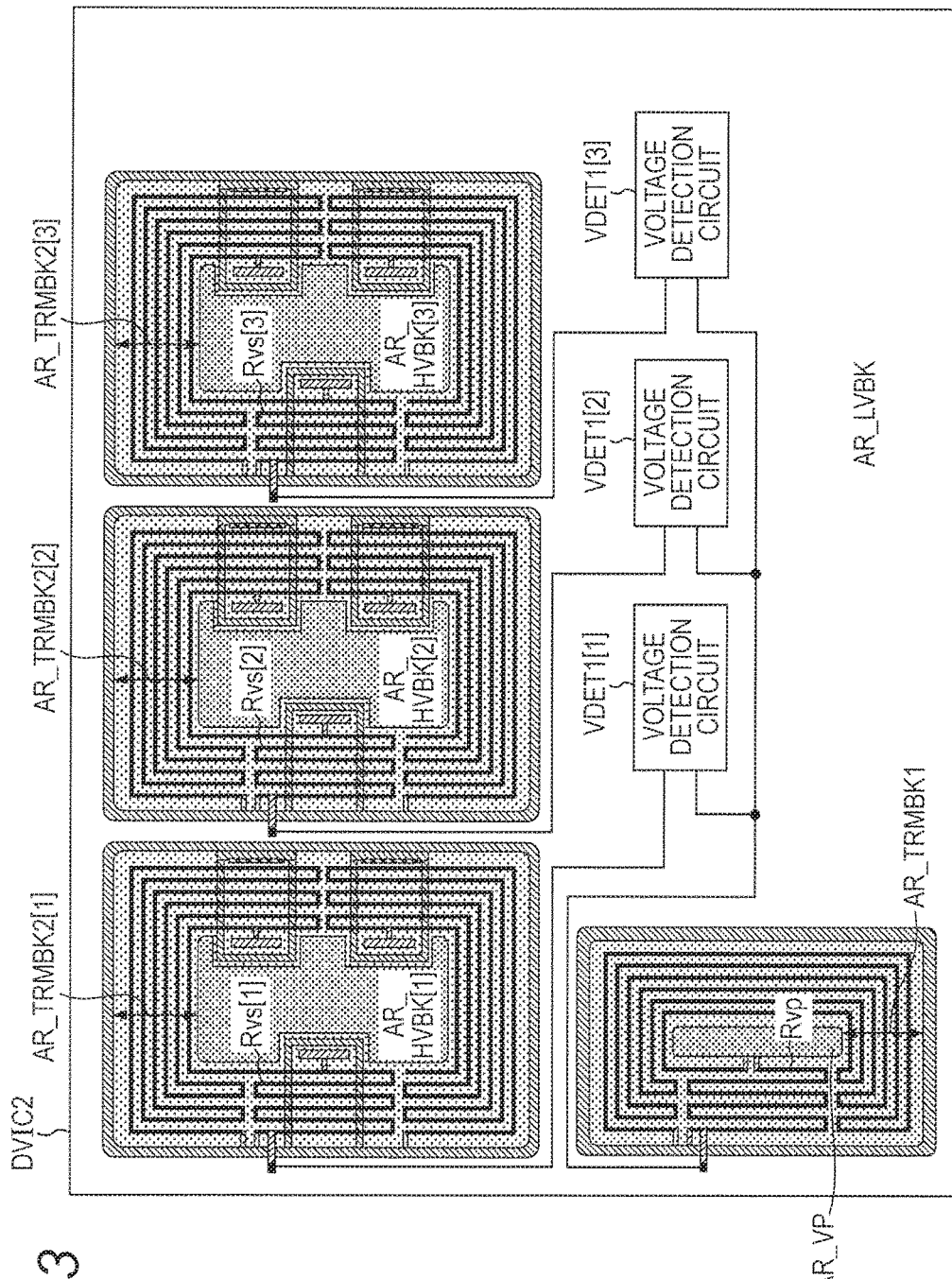
FIG. 13 is a plan diagram showing a schematic layout configuration example of a part of a driver IC in the power control device of FIG. 12.

FIG. 13 is a plan diagram showing a schematic layout configuration example of a part of the driver IC in the power control device of FIG. 12. The driver IC (semiconductor device) DVIC2 shown in FIG. 13 is comprised of one semiconductor chip and equipped with termination areas AR_TRMBK2 ([1], [2], [3]) and high side areas AR_HVBK ([1], [2], [3]) for every three phases, and a termination area AR_TRMBK1 and a power supply application area AR_VP common to the three phases.

Resistive elements Rvs ((11, [2], [3]) are respectively formed in the termination areas AR_TRMBK2 ([1], [2], [3]), and a resistive element Rvp is formed in the termination area AR_TRMBK1. Voltage detection circuits VDET1 ([1], [2], [3]) for every three phases are disposed in a low side area AR_LVBK. The voltage detection circuits VDET1 ([1], [2], [3]) respectively have one inputs coupled together to the resistive element Rvp, and the other inputs respectively coupled to the resistive elements Rvs ([1], [2], [3]).

Thus, when the driver IC (DVIC2) is an IC which drives a plurality of phases of transistors, the termination area AR_TRMBK1 and the power supply application area AR_VP can be provided common in plural phases. As a result, it is possible to suppress an overhead of a chip area. Further, though it may be difficult for such a driver IC to arrange the resistive element Rvp and the resistive elements Rvs ([1], [2], [3]) adjacently as in the case of FIG. 11, the resistive elements Rvp and Rvs ([1], [2], [3]) are capable of maintaining substantially the identity if they are within the same semiconductor chip. In the example of FIG. 13, in order to more improve the identity, the respective resistive elements Rvp and Rvs ([1], [2], [3]) are disposed so as to assume the same direction.

As described above, the various effects described in the embodiment 1 can be obtained by using the semiconductor device and the power control device according to the embodiment 2 while suppressing the overhead of the chip area. Incidentally, although there is shown here the driver IC which drives the three phases, a similar effect is obtained of course even in the case of a driver IC or the like which drives two phases.

Embodiment 3

Schematic Circuit Configuration of Power Control Device (Application Example [2])

Figure 14:
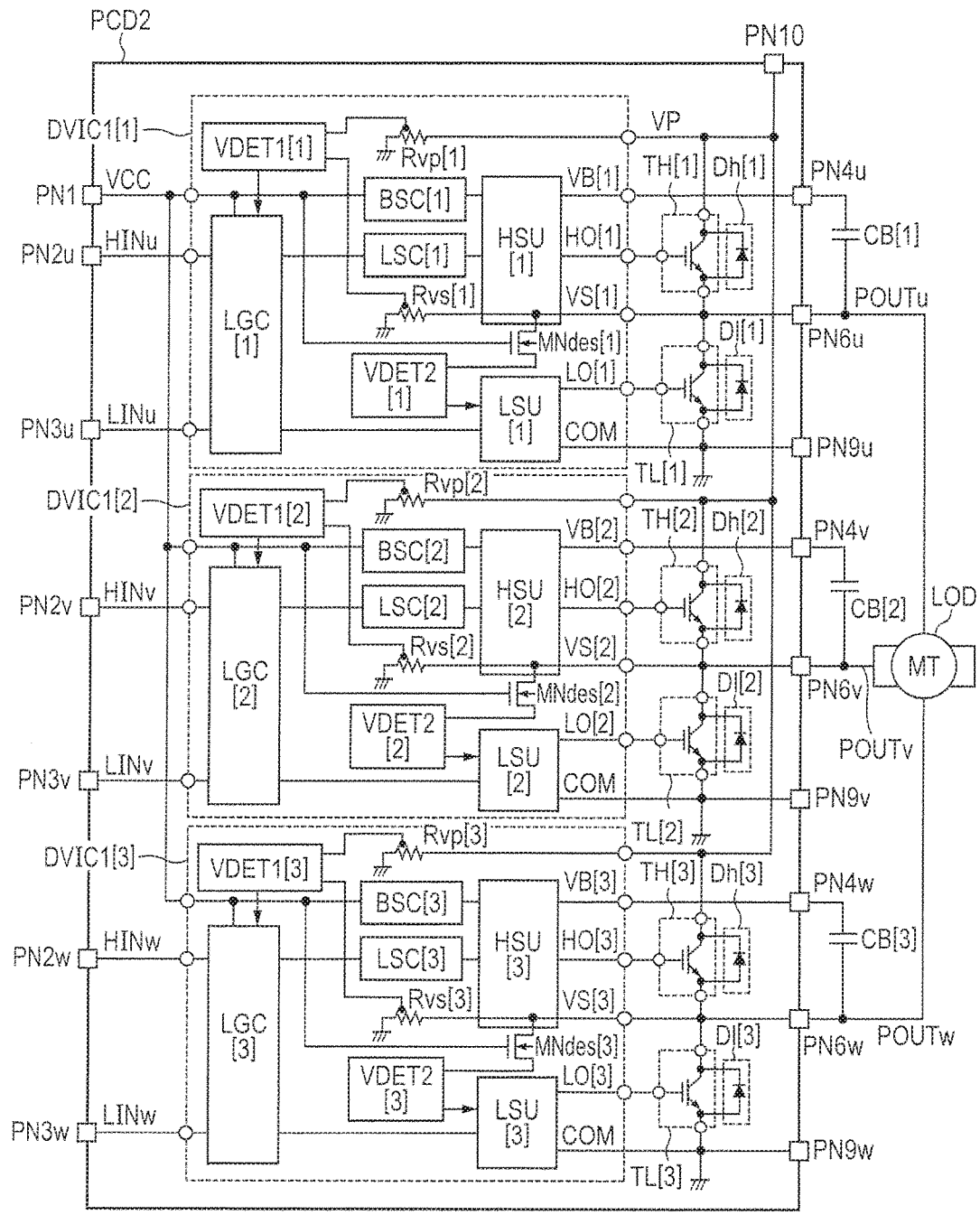
FIG. 14 is a circuit block diagram showing a schematic configuration example including a peripheral section, of a power control device according to an embodiment 3 of the present invention.

FIG. 14 is a circuit block diagram showing a schematic configuration example including a peripheral section, of a power control device according to an embodiment 3 of the present invention. A configuration example of an electronic system including a power control device PCD2 comprised of one package, three boot strap capacitors CB [1] through CB [3] which serve as external parts of the power control device PCD2, and a load circuit LOD is shown in FIG. 14 as with the case of FIG. 12. However, unlike the power control device PCD1 of FIG. 12, the power control device PCD2 of FIG. 14 is equipped with three drivers IC (DVIC1 [1], [2], [3]) which respectively drive three phases. Since the power control device PCD2 is similar to the case of FIG. 12 in terms of configurations other than the above, their detailed description will be omitted.

Each of the drivers IC (DVIC1 ([1], [2], [3])) has a configuration similar to that of the driver IC (DVIC1) of FIG. 2. As a result, unlike the case of FIG. 12, the drivers IC (DVIC1 ([1], [2], [3])) are individually equipped with resistive elements Rvp ([1], [2], [3]) and correspondingly individually equipped with high potential side power supply pads (PD10 of FIG. 2) each coupled to a high potential side power supply voltage VP. The high potential side power supply pads of the drivers IC (DVIC1 ([1], [2], [3]) are coupled commonly to an external pin PN10 within a package. Further, the drivers IC (DVIC1 [1], [2], [3]) are also individually equipped with pads (PD1 of FIG. 2) for coupling to an external pin PN1 supplied with a power supply voltage VCC.

Schematic Package Configuration of Power Control Device (Application Example [2]))

Figure 15:
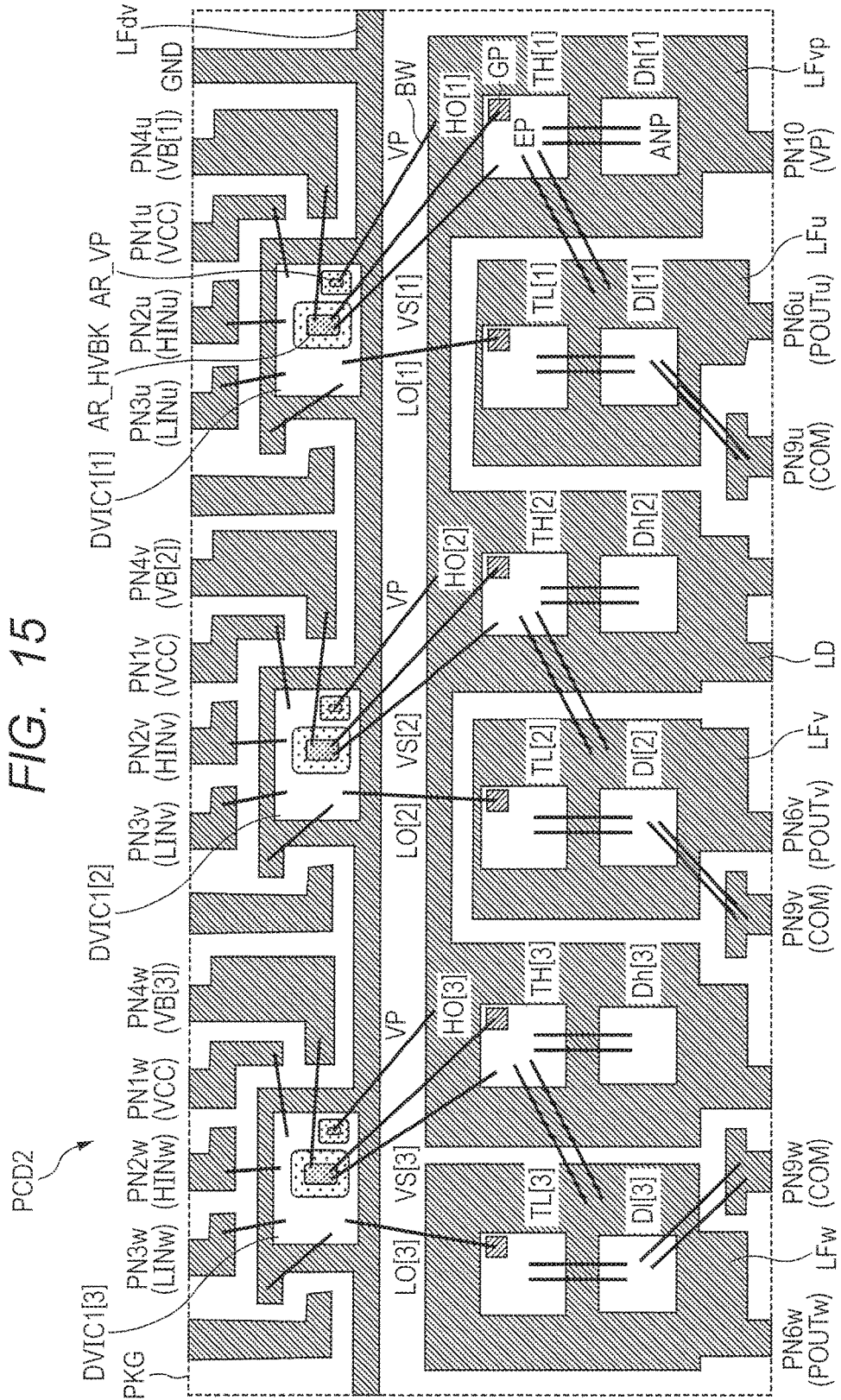
FIG. 15 is a plan diagram showing a schematic package configuration example of the power control device of FIG. 14.

FIG. 15 is a plan diagram showing a schematic package configuration example of the power control device of FIG. 14. The power control device PCD2 shown in FIG. 15 is equipped with a plurality of lead frames LFvp, LFu, LFv, LFw, and LFdv, and a plurality of leads LD respectively corresponding to the external pins shown in FIG. 14 and has a configuration in which these are sealed with a package PKG such as an epoxy resin. Parts of the leads LD are integrated with the lead frames LFvp, LFu, LFv, LFw, and LFdv.

The lead frame LFdv is equipped with three drivers IC (DVIC1 [1], [2], [3]). The lead frame LFdv is supplied with, for example, a ground power supply voltage GND. The lead frame LFvp is integrated with the external pin (lead LD) PN10 coupled to a high potential side power supply voltage VP. The lead frame LFvp is equipped with three high side transistors TH [1] through TH [3], and three high side free wheeling diodes Dh [1] through Dh [3].

The lead frame LFu is integrated with an external pin PN6u which outputs a u-phase load drive signal POUTu. The lead frame LFu is equipped with a low side transistor TL [1] and a low side free wheeling diode Dl [1]. The lead frame LFv is integrated with an external pin PN6v which outputs a v-phase load drive signal POUTv. The lead frame LFv is equipped with a low side transistor TL [2] and a low side free wheeling diode Dl [2]. The lead frame LFw is integrated with an external pin PN6w which outputs a w-phase load drive signal POUTw. The lead frame LFw is equipped with a low side transistor TL [3] and a low side free wheeling diode Dl [3].

Each of the three high side transistors TH [1] through TH [3] and the three low side transistors TL [1] through TL [3] has a vertical device structure in which with a mounting surface (i.e., back surface) onto each lead frame as a collector pad, an emitter pad EP and a gate pad GP are disposed over the surface of the lead frame. Further, each of the three high side free wheeling diodes Dh [1] through Dh [3] and the three low side free wheeling diodes Dl [1] through Dl [3] has a vertical device structure in which with the mounting surface (i.e., back surface) onto each lead frame as the cathode pad, an anode pad ANP is disposed over the surface of the lead frame.

The emitter pad EP of the high side transistor TH [1], the anode pad ANP of the high side free wheeling diode Dh [1], and the external pin PN6u are coupled to each other through bonding wires BW. Likewise, the emitter pad of the high side transistor TH [2], the anode pad of the high side free wheeling diode Dh [2], and the external pin PN6v are coupled in common. The emitter pad of the high side transistor TH [3], the anode pad of the high side free wheeling diode Dh [3], and the external pin PN6w are coupled in common.

The emitter pad EP of the low side transistor TL [1], the anode pad ANP of the low side free wheeling diode Dl [1], and the external pin PN9u are coupled to each other through bonding wires BW. Likewise, the emitter pad of the low side transistor TL [2], the anode pad of the low side free wheeling diode Dl [2], and the external pin PN9v are coupled in common. The emitter pad of the low side transistor TL [3], the anode pad of the low side free wheeling diode Dl [3], and the external pin PN9w are coupled in common.

A high side area AR_HVBK of the driver IC (DVIC1 [1]) is coupled to the emitter pad EP (i.e., floating voltage VS [1]) and the gate pad GP of the high side transistor TH [1] through the bonding wires BW. The high side area AR_HVBK outputs a high side output signal HO [1] to the gate pad GP. Further, in addition to the above, the high side area AR_HVBK is coupled to an external terminal PN4u (i.e., boot power supply voltage VB [1]) through a bonding wire BW.

A power supply application area AR_VP (specifically, for example, metal wiring ML4a of FIG. 10) of the driver IC (DVIC1 [1]) is coupled to the lead frame LFvp through a bonding wire BW. A low side area AR_LVBK of the driver IC (DVIC1 [1]) is coupled to the gate pad GP of the low side transistor TL [1] through a bonding wire BW and outputs a low side output signal LO [1] to the gate pad GP. In addition, the low side area AR_LVBK is coupled to external terminals PN1u, PN2u, and PN3u (i.e., power supply voltage VCC, high side input signal HINu, and low side input signal LINu) through bonding wires BW respectively.

Respective wirings of the drivers IC (DVIC1 [2], DVIC1 [3]) are also similar to those of the driver IC (DVIC1 [1]). Described in brief, a high side area AR_HVBK of the driver IC (DVIC1 [2]) is coupled to the emitter pad and gate pad of the high side transistor TH [2] and additionally coupled to an external terminal PN4v (i.e., boot power supply voltage VB [2]). A power supply application area AR_VP of the driver IC (DVIC1 [2]) is coupled to the lead frame LFvp. A low side area AR_LVBK of the driver IC (DVIC1 [2]) is coupled to a gate pad of the low side transistor TL [2] and external terminal PN1v, PN2v, and PN3v (i.e., power supply voltage VCC, high side input signal HINv, and low side input signal LINv) respectively.

Likewise, a high side area AR_HVBK of the driver IC (DVIC1 [3]) is coupled to the emitter pad and gate pad of the high side transistor TH [3] and additionally coupled to an external terminal PN4w (i.e., boot power supply voltage VB [3]). A power supply application area AR_VP of the driver IC (DVIC1 [3]) is coupled to the lead frame LFvp. A low side area AR_LVBK of the driver IC (DVIC1 [3]) is coupled to a gate pad of the low side transistor TL [3] and external terminals PN1w, PN2w, and PN3w (i.e., power supply voltage VCC, high side input signal HINw, and low side input signal LINw) respectively.

As described above, the number of parts in the system including the driver IC (semiconductor device) can be reduced as with the case of the embodiment 1 by using the semiconductor device and the power control device PCD2 according to the embodiment 3. Described specifically, when such a driver IC (DVIC') as shown in FIG. 16 is used as the comparative example, it is necessary to provide the parts such as the high breakdown voltage diodes Ddesh and Ddesl, corresponding to the three phases within the system. When the drivers IC (DVIC1 ([1], [2], [3])) of FIG. 14 are used, such parts become unnecessary.

Further, when such a driver IC (DVIC') as in FIG. 16 is used, the construction itself of the power control device PCD2 as one package PKG (i.e., one part) such as shown in FIGS. 14 and 15 may become difficult with the parts such as the diodes Ddesh, Ddesl, etc. Described specifically, the parts such as the high breakdown voltage diodes Ddesh and Ddesl, etc. are normally hard to be mixed into the package PKG. Therefore, as one method, there is mentioned a method of appropriately combining the driver IC parts, the high breakdown voltage diode parts, the respective arm (HA, LA) parts, etc. Further, as another method, there is mentioned a method of providing in a package, external pins (i.e., two external pins which are taken out outside the package once and returned again to within the package) for external part coupling in large numbers and coupling the parts such as the diodes Ddesh and Ddesl, etc. thereto.

In such a method, however, it is difficult to sufficiently reduce the number of parts. There is a case where it is not possible to attain miniaturization of the system and its cost reduction. Further, an increase of external pins can lead to the enlargement of the system and an increase in cost. Therefore, the driver IC according to the embodiment is used to thereby construct the power control device PCD2 by one package PKG as shown in FIGS. 14 and 15, thus resulting in a benefit.

Although the invention made above by the present inventors has been described specifically on the basis of the preferred embodiments, the present invention is not limited to the embodiments referred to above, but may be changed in various ways within the scope not departing from the gist thereof. For example, the aforementioned embodiments have been described in detail to describe the present invention in a way easy to understand. They are not necessarily limited to one having all configurations described. Also, a part of the configuration of one embodiment may be replaced with the configuration of another embodiment. Further, the configuration of one embodiment may also be added with the configuration of another embodiment. Moreover, the addition/deletion/replacement of other configuration can be made to a part of the configuration of each embodiment.

For example, though the driver IC (DVIC1) shown in FIGS. 1 and 2 has been the IC driving the high side transistor TH and the low side transistor TL, the driver IC is not limited to it in particular. For example, the driver IC may be an IC which drives only the high side transistor TH. In this case, the pad PD8 is unnecessary in FIG. 1, and the low side drive circuit LSDC and the pads PD3, PD7, and PD8 are unnecessary in FIG. 2. At this time, the failure detection signal FDET2 from the voltage detection circuit VDET2 is outputted to the outside (e.g., micon or the like which outputs the low side input signal LIN) of the IC through the input signal processing circuit LGC. Further, each of the power control device PCD1 of FIG. 12 and the power control device PCD2 of FIG. 14 may also similarly be a configuration having no low side transistors TL [1] through TL [3] of each phase or low side drive circuits LSDC [1] through LSDC [3].

APPENDIX (1) A semiconductor device according to an embodiment drives a high side transistor disposed outside and coupled between a high potential side power supply voltage and a floating voltage, and is comprised of one semiconductor chip. The semiconductor device has a high potential side power supply pad, a floating pad, a low potential side power supply pad, first and second resistive elements, and a voltage detection circuit. The high potential side power supply pad is coupled to the high potential side power supply voltage. The floating pad is coupled to the floating voltage. The low potential side power supply pad is coupled to a low potential side power supply voltage. The first resistive element has both ends respectively coupled to the high potential side power supply voltage and the low potential side power supply voltage. The second resistive element has both ends respectively coupled to the floating voltage and the low potential side power supply voltage. The voltage detection circuit detects a difference voltage between a voltage resistance-divided by the first resistive element and a voltage resistance-divided by the second resistive element.

(2) The semiconductor device described in the above (1) further has a power supply application area, a high side area, a low side area, first and second termination areas, first and second isolation areas, and a high side driver. The power supply application area is applied with the high potential side power supply voltage. The high side area is formed with a circuit operated at a first power supply voltage with the floating voltage as a reference. The low side area is formed with a circuit operated at a second power supply voltage with the low potential side power supply voltage as a reference. The first termination area is disposed in a ring form so as to surround the power supply application area. The second termination area is disposed in a ring form so as to surround the high side area. The first isolation area is disposed along an outer periphery of the first termination area and isolates the first termination area and the low side area from each other. The second isolation area is disposed along an outer periphery of the second termination area and isolates the second termination area and the low side area from each other. The high side driver is formed in the high side area and drives the high side transistor. Then, the first resistive element is formed in the first termination area. The second resistive element is formed in the second termination area. The voltage detection circuit is formed in the low side area.

(3) In the semiconductor device described in the above (2), the first isolation area is supplied with the low potential side power supply voltage. The first resistive element is formed of a polysilicon wiring which couples the power supply application area and the first isolation area.

(4) A semiconductor device according to an embodiment drives a high side transistor disposed outside and coupled between a high potential side power supply voltage and a floating voltage, and is comprised of one semiconductor chip. The semiconductor device has a floating pad, a low potential side power supply pad, a high side area, a low side area, a second termination area, a second isolation area, a high side driver, a level shift transistor, a second resistive element, and a voltage detection circuit. The floating pad is coupled to the floating voltage, and the low potential side power supply pad is coupled to a low potential side power supply voltage. The high side area is formed with a circuit operated at a first power supply voltage with the floating voltage as a reference. The low side area is formed with a circuit operated at a second power supply voltage with the low potential side power supply voltage as a reference. The second termination area is disposed in a ring form so as to surround the high side area. The second isolation area is disposed along an outer periphery of the second termination area and isolates the second termination area and the low side area from each other. The high side driver is formed in the high side area and drives the high side transistor. The level shift transistor is formed in the second termination area, and converts a signal generated in the low side area and based on the low potential side power supply voltage into a signal based on the floating voltage and outputs the same to the high side area. The second resistive element is formed in the second termination area and has both ends respectively coupled to the floating voltage and the second isolation area used in the high side area. The voltage detection circuit is formed in the low side area and detects a voltage resistance-divided by the second resistive element.

What is claimed is:

1. A semiconductor device which drives a high side transistor disposed outside and coupled between a high potential side power supply voltage and a floating voltage and is comprised of one semiconductor chip, comprising:
    a high potential side power supply pad coupled to the high potential side power supply voltage;
    a floating pad coupled to the floating voltage;
    a low potential side power supply pad coupled to a low potential side power supply voltage;
    a power supply application area applied with the high potential side power supply voltage;
    a high side area formed with a circuit operated at a first power supply voltage with the floating voltage as a reference;
    a low side area formed with a circuit operated at a second power supply voltage with the low potential side power supply voltage as a reference;
    a first termination area which is disposed in a ring form so as to surround the power supply application area and absorbs a difference in potential between the power supply application area and the low side area;
    a second termination area which is disposed in a ring form so as to surround the high side area and absorbs a difference in potential between the high side area and the low side area;
    a first isolation area which is disposed along an outer periphery of the first termination area and isolates the first termination area and the low side area from each other;
    a second isolation area which is disposed along an outer periphery of the second termination area and isolates the second termination area and the low side area from each other; and
    a high side driver which is formed in the high side area and drives the high side transistor.

2. The semiconductor device according to claim 1,
    wherein the first isolation area is supplied with the low potential side power supply voltage,
    wherein the first termination area is formed with a first resistive element having both ends respectively coupled to the power supply application area and the first isolation area, and
    wherein the low side area is formed with a voltage detection circuit which detects a voltage resistance-divided by the first resistive element.

3. The semiconductor device according to claim 2, wherein the first resistive element is a polysilicon wiring, and extends along a circumferential direction of the first termination area and couples the power supply application area with the first isolation area while being turned back at a prescribed boundary.

4. The semiconductor device according to claim 2,
    wherein the second isolation area is supplied with the low potential side power supply voltage,
    wherein the second termination area is formed with:
        a level shift transistor which converts a signal generated in the low side area and based on the low potential side power supply voltage into a signal based on the floating voltage and outputs the same to the high side area; and
        a second resistive element having both ends respectively coupled to the floating voltage used in the high side area and the second isolation area used in the high side area, and
    wherein the voltage detection circuit detects a difference voltage between a voltage resistance-divided by the first resistive element and a voltage resistance-divided by the second resistive element.

5. The semiconductor device according to claim 4, wherein the voltage detection circuit detects an overcurrent flowing through the high side transistor.

6. The semiconductor device according to claim 4,
    wherein the second termination area is formed with a field plate wiring,
    wherein the field plate wiring is a polysilicon wiring disposed in a forming area of the level shift transistor, and extends along a circumferential direction of the second termination area and couples an output node of the level shift transistor with the second isolation area while being turned back at a prescribed boundary,
    wherein the second resistive element is a polysilicon wiring, and extends along the circumferential direction of the second termination area and couples the floating voltage with the second isolation area while being turned back at a prescribed boundary, and
    wherein the first resistive element is a polysilicon wiring, and extends along the circumferential direction of the first termination area and couples the power supply application area with the first isolation area while being turned back at a prescribed boundary.

7. The semiconductor device according to claim 1,
    wherein the semiconductor chip further drives a low side transistor disposed outside and coupled between the floating voltage and the low potential side power supply voltage, and
    wherein the semiconductor device further has a low side driver which is formed in the low side area and drives the low side transistor.

8. A semiconductor device which drives a plurality of phases of high side transistors disposed outside and respectively coupled between a high potential side power supply voltage and a plurality of phases of floating voltages, and is comprised of one semiconductor chip, comprising:
    a high potential side power supply pad coupled to the high potential side power supply voltage;
    a plurality of phases of floating pads respectively coupled to the phases of floating voltages;
    a low potential side power supply pad coupled to a low potential side power supply voltage;
    a plurality of phases of drive circuit areas which respectively drive respective phases of the phases of high side transistors;
    a power supply application area applied with the high potential side power supply voltage;
    a first termination area disposed in a ring form so as to surround the power supply application area; and
    a first isolation area disposed along an outer periphery of the first termination area,
    wherein the phases of drive circuit areas respectively have
        a high side area formed with a circuit operated at a first power supply voltage with the floating voltage of a corresponding phase as a reference,
        a low side area formed with a circuit operated at a second power supply voltage with the low potential side power supply voltage as a reference,
        a second termination area disposed in a ring form so as to surround the high side area,
        a second isolation area which is disposed along an outer periphery of the second termination area and isolates the second termination area and the low side area from each other, and a high side driver which is formed in the high side area and drives the high side transistor of the corresponding phase.

9. The semiconductor device according to claim 8,
wherein the first isolation area is supplied with the low potential side power supply voltage,
wherein the first termination area is formed with a first resistive element having both ends respectively coupled to the power supply application area and the first isolation area,
wherein the second termination area is formed with:
a level shift transistor which converts a signal generated in the low side area and based on the low potential side power supply voltage into a signal based on the floating voltage of the corresponding phase and outputs the same to the high side area; and
a second resistive element having both ends respectively coupled to the floating voltage of the corresponding phase used in the high side area and the second isolation area, and
wherein the low side area is formed with a voltage detection circuit which detects a difference voltage between a voltage resistance-divided by the first resistive element and a voltage resistance-divided by the second resistive element.

10. The semiconductor device according to claim 9, wherein the voltage detection circuit detects an overcurrent which flows through the high side transistor of the corresponding phase.

11. The semiconductor device according to claim 9, wherein the first resistive element is a polysilicon wiring, and extends along a circumferential direction of the first termination area and couples the power supply application area with the first isolation area while being turned back at a prescribed boundary.

12. The semiconductor device according to claim 8,
wherein the semiconductor chip further drives a plurality of phases of low side transistors disposed outside and respectively coupled between the phases of floating voltages and the low potential side power supply voltage, and
wherein each of the phases of drive circuit areas further has a low side driver which is formed in the low side area and drives the low side transistor of the corresponding phase.

13. A power control device comprised of one package, comprising:
a high potential side power supply pin coupled to a high potential side power supply voltage;
a low potential side power supply pin coupled to a low potential side power supply voltage;
a load drive pin coupled to a floating voltage;
a high side transistor provided between the high potential side power supply pin and the load drive pin; and
a semiconductor chip which drives the high side transistor,
wherein the semiconductor chip includes:
a power supply application area applied with the high potential side power supply voltage,
a high side area formed with a circuit operated at a first power supply voltage with the floating voltage as a reference,
a low side area formed with a circuit operated at a second power supply voltage with the low potential side power supply voltage as a reference,
a first termination area which is disposed in a ring form so as to surround the power supply application area and absorbs a difference in potential between the power supply application area and the low side area,
a second termination area which is disposed in a ring form so as to surround the high side area and absorbs a difference in potential between the high side area and the low side area,
a first isolation area which is disposed along an outer periphery of the first termination area and isolates the first termination area and the low side area from each other,
a second isolation area which is disposed along an outer periphery of the second termination area and isolates the second termination area and the low side area from each other, and
a high side driver which is formed in the high side area and drives the high side transistor.

14. The power control device according to claim 13, comprising a bonding wire which couples the high potential side power supply pin to the power supply application area of the semiconductor chip.

15. The power control device according to claim 13,
wherein the first isolation area is supplied with the low potential side power supply voltage,
wherein the first termination area is formed with a first resistive element having both ends respectively coupled to the power supply application area and the first isolation area, and
wherein the low side area is formed with a voltage detection circuit which detects a voltage resistance-divided by the first resistive element.

16. The power control device according to claim 15, wherein the first resistive element is a polysilicon wiring, and extends along a circumferential direction of the first termination area and couples the power supply application area with the first isolation area while being turned back at a prescribed boundary.

17. The power control device according to claim 15,
wherein the second isolation area is supplied with the low potential side power supply voltage,
wherein the second termination area is formed with:
a level shift transistor which converts a signal generated in the low side area and based on the low potential side power supply voltage into a signal based on the floating voltage and outputs the same to the high side area; and
a second resistive element having both ends respectively coupled to the floating voltage used in the high side area and the second isolation, and
wherein the voltage detection circuit detects a difference voltage between a voltage resistance-divided by the first resistive element and a voltage resistance-divided by the second resistive element.

18. The power control device according to claim 17, wherein the voltage detection circuit detects an overcurrent which flows through the high side transistor.

19. The power control device according to claim 17, wherein the second termination area is formed with a field plate wiring,
wherein the field plate wiring is a polysilicon wiring disposed in a forming area of the level shift transistor, and extends along a circumferential direction of the second termination area and couples an output node of the level shift transistor with the second isolation area while being turned back at a prescribed boundary,
wherein the second resistive element is a polysilicon wiring, and extends along the circumferential direction of the second termination area and couples the floating voltage with the second isolation area while being turned back at a prescribed boundary, and wherein the first resistive element is a polysilicon wiring, and extends along the circumferential direction of the first termination area and couples the power supply application area with the first isolation area while being turned back at a prescribed boundary.

20. The power control device according to claim 13, wherein the power control device further comprises a low side transistor provided between the load drive pin and the low potential side power supply pin, and wherein the semiconductor chip further has a low side driver which is formed in the low side area and drives the low side transistor.

\* \* \* \* \*